US005528158A

United States Patent [19]
Sinsheimer et al.

[11] Patent Number: 5,528,158
[45] Date of Patent: Jun. 18, 1996

[54] PROBE CARD CHANGER SYSTEM AND METHOD

[75] Inventors: Roger Sinsheimer; Tom Richards, both of Petaluma, Calif.

[73] Assignee: Xandex, Inc., Petaluma, Calif.

[21] Appl. No.: 226,154

[22] Filed: Apr. 11, 1994

[51] Int. Cl.⁶ .................................................. G01R 31/02
[52] U.S. Cl. .................................... 324/758; 324/754
[58] Field of Search ............................... 324/754, 755, 324/757, 758

[56] References Cited

U.S. PATENT DOCUMENTS

| | | | |
|---|---|---|---|
| 4,105,970 | 8/1978 | Katz | 324/761 |
| 4,746,855 | 5/1988 | Wrinn | 324/763 |
| 4,757,254 | 7/1988 | Staples | 324/757 |
| 4,935,696 | 6/1990 | DiPerna | 324/761 |
| 5,019,771 | 5/1991 | Yang et al. | 324/754 |
| 5,030,907 | 7/1991 | Yih et al. | 324/754 |
| 5,068,601 | 11/1991 | Parmenter | 324/754 |
| 5,254,939 | 10/1993 | Anderson et al. | 324/754 |

FOREIGN PATENT DOCUMENTS

| | | |
|---|---|---|
| 01-161173 | 6/1989 | Japan. |
| 02-001141 | 1/1990 | Japan. |
| 2066590 | 7/1981 | United Kingdom. |
| 2242081 | 9/1991 | United Kingdom. |

*Primary Examiner*—Ernest F. Karlsen
*Assistant Examiner*—Russell M. Kobert
*Attorney, Agent, or Firm*—Townsend and Townsend and Crew

[57] ABSTRACT

A prober tester interface system and a method for loading a probe card into a prober. The interface system includes a stiffener for holding a probe card, the stiffener having an upper surface, a perimeter, an underside, a plurality of recesses in the underside around the perimeter, and first and second alignment holes. A theta ring for holds the stiffener in the prober, the theta ring having first alignment pins for engaging the first alignment holes, a plurality of lock cylinders for engaging the recesses, and a machined lip against which the upper surface of the stiffener is forced by the lock cylinders. A loader is coupled to the prober for loading the stiffener in and unloading the stiffener from the theta ring, the loader having second alignment pins for engaging the second alignment holes. A theta drive assembly is coupled to the theta ring for rotating the theta ring to align the probe card with the test head. In a specific embodiment, the test head includes a contactor, and the theta ring includes a plurality of clamp cylinders for locking the contactor in theta and Z while a probe card is being loaded or unloaded.

28 Claims, 22 Drawing Sheets

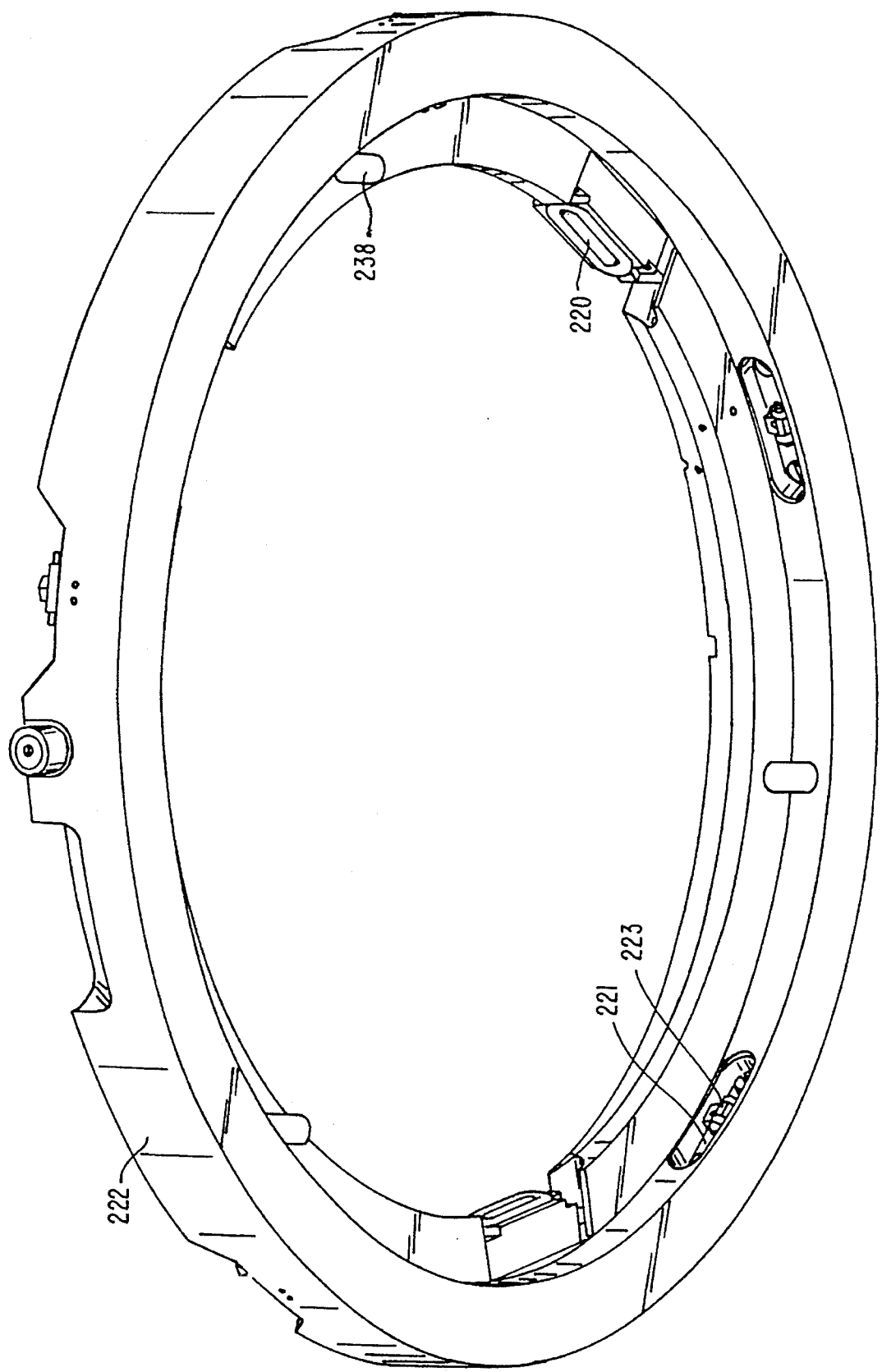

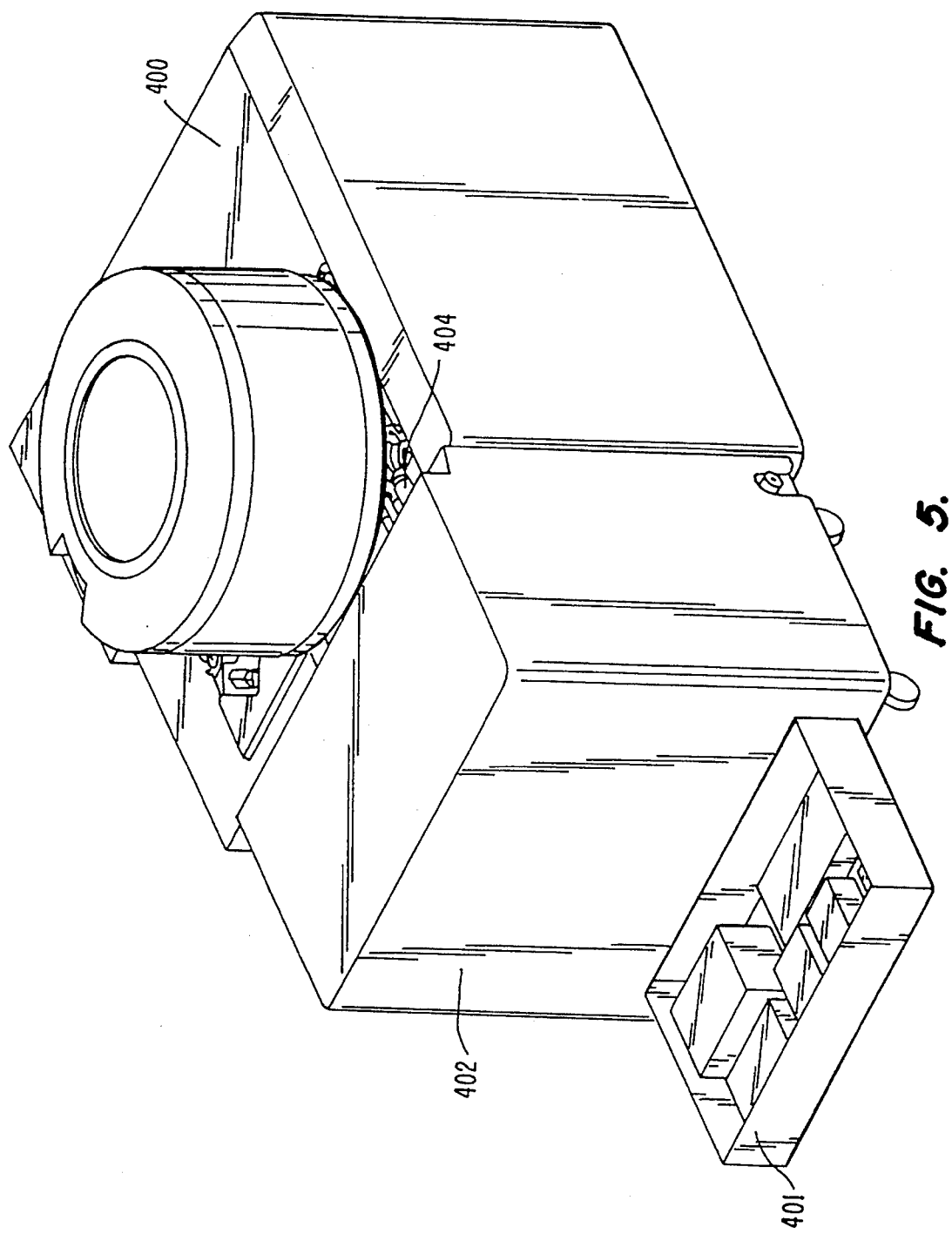

1

PROBE CARD CHANGER SYSTEM AND METHOD

BACKGROUND OF THE INVENTION

The present invention relates generally to the field of electronic test systems. More specifically, the invention provides an improved method and apparatus for performing probe tests on semiconductor wafers.

Various types of wafer test and probe equipment are well known to those of skill in the art, and are widely used in semiconductor manufacturing operations. Such equipment is used to provide electrical signals to a plurality of dies, generally formed on a semiconductor wafer, and to monitor the response of the dies to the electrical signals. Wafer test and probe equipment is made by a variety of manufacturers including, for example, Electroglas, Inc., KLA Instruments, Teradyne, Inc., Schlumberger Technologies, and LTX-Trillium.

Semiconductor wafer testing is normally conducted prior to wafer dicing and chip packaging. The wafer is placed on a prober chuck, indexed, and each die is tested. The testing operation normally involves placing a probe card with a number of probe tips in contact with a particular die at selected locations, such as, for example, the bond pads. Predetermined voltage patterns are then applied to the die, and the response of the die to the signals is monitored. If the die exhibits an appropriate response, the die is presumed to be "good." If the monitored response falls outside performance parameters, the die is either rejected, or appropriate remedial action is taken. Such wafer tests are performed on a wide variety of semiconductor products ranging from DRAMs and SRAMs to microprocessors.

Because modem semiconductor devices are being developed to operate at higher and higher speeds, "overhead" test techniques have been developed to keep signal transmission lines as short as possible. Short transmission lines reduce cross-talk between adjacent lines and eliminate other undesirable high frequency effects. In overhead testing techniques, a section of the tester referred to as the test head is positioned over the wafer under test and then docked to the prober. The interface between the test head and the wafer comprises a printed circuit board (Performance Interface Board or PIB), a plurality of downwardly extending spring loaded pins (Pogo® pins) and a probe card. The PIB and the Pogo pins are coupled to the test head which, when docked, causes the pins to come into contact with the probe card. The probe card is a custom printed circuit board which fores the connection between the Pogo pins and the probes (pins) which actually contact the wafer. Some systems use the weight of the test head to compress the Pogo pins against the probe card. Others employ a vacuum which forms a seal on the probe card to supply the necessary force. Still other systems have combined the PIB with the probe card to further reduce the signal transmission distances from the test head to the wafer. This has resulted in an increase in the size of stiffener/probe card assemblies.

While enjoying some measure of success, such prior systems have also encountered certain difficulties. One such difficulty is related to the fact that the arrangement of the bonding pad (used for testing) locations for various devices belonging to a family of products will differ from device type to device type, thus requiring different probe cards for testing each device type. For example, the arrangement of probes on a probe card for testing 1M DRAMs is radically different from the arrangement of probes on a probe card intended for testing of 4M DRAMs. Therefore, when the user of a prior system desires to switch the wafer product being tested, or if probe card gets damaged or dirty during testing, it becomes necessary to remove and replace the currently installed probe card. This is a time consuming and difficult task for a number of reasons. First, in many systems the probe card is mounted under the test head, which must be undocked before the probe card may be removed. This proves difficult because most test heads weigh between 250 and 750 pounds. Additionally, in most systems, the interface between the test head and the probe card must be disassembled and then reassembled. Finally, recalibration of probe card and test head positioning is required after replacement of a probe card.

As device density increases due to advances in semiconductor fabrication, probe card probes density also increases. Thus, the performance of the probe card interface system has become increasingly critical to successful device testing. In order to ensure proper contact between probe card probe tips and the device under test, significantly tight alignment must be maintained among the probes. In addition, at high densities, the probe card is commonly subjected to significant force while probes are in contact for testing. Because of the often delicate nature of probe card pins, such pressure frequently causes pin damage and/or misalignment. Thus, probe cards often require maintenance after repeated contacts with semiconductor wafers.

Conventionally, those of skill in the an have had no effective way of recording the operating history of a probe card. Therefore, contact failures only have been detected after the fact using, for example, a method such as the one disclosed by U.S. Pat. No. 5,019,771, the entire specification and drawings of which are herein incorporated by reference. Using such reactive methods, however, a probe card is replaced and/or repaired only after a failure has occurred. This results in undesirable system down time.

The problem of maintaining records on individual probe cards is made difficult by the fact that probe cards are frequently moved in and out of a testing system as described above. One solution involves manually labelling the various probe cards, and manually entering information regarding probe card usage on data sheets or into a computer. Unfortunately, this becomes difficult or impractical when large numbers of probe cards are in use. Additionally, the procedure is highly susceptible to human error.

Systems which present specific solutions to the above-described problems are disclosed in commonly assigned U.S. Pat. No. 5,254,939 for PROBE CARD SYSTEM AND METHOD, commonly assigned, copending U.S. patent application Ser. No. 08/089,874, filed on Jul. 9, 1993, as a continuation of the '939 patent, and commonly assigned, copending U.S. patent application Ser. No. 08/183,596, filed on Jan. 19, 1994, the entire specifications and drawings of which are herein incorporated by reference. The systems described in these documents provide excellent solutions to the above-described problems. However, because of specific industry needs, other solutions are needed.

In view of the foregoing, an improved system and method for conducting wafer probe tests is needed which provides a sturdy, simple, quick and reliable interface to load probe cards under a test head. An improved system and method for tracking individual probe card usage and performance as well as its alignment position under the test head is also desirable.

SUMMARY OF THE INVENTION

According to the present invention, an improved wafer testing method and prober to test head interface system is provided. The system, also referred to hereinafter as the "AutoLoader" provides for convenient loading and changing of probe cards, as well as a more effective means for positioning probe cards during test operations. The present invention is also directed to a systematic method and device for probe card data collection.

According to one embodiment, a prober to test head interface system is provided which includes a stiffener for holding a probe card, the stiffener having an upper surface, a perimeter, an underside, a plurality of recesses in the underside around the perimeter, and first and second alignment holes. The system also includes a theta ring for holding the stiffener, the theta ring having first alignment pins for engaging the first alignment holes, a plurality of lock cylinders for engaging the recesses, and a machined lip against which the upper surface of the stiffener is forced by the lock cylinders. A loader is coupled to the prober for loading the stiffener in and unloading the stiffener from the theta ring, the loader having second alignment pins for engaging the second alignment holes. A theta drive assembly is coupled to the theta ring for rotating the theta ring to align the probe card with the wafer. In a specific embodiment, the test head comprises a contactor, and the theta ring includes a plurality of clamp cylinders for locking the contactor in theta and Z while a probe card is being loaded or unloaded.

The present invention includes both manual and automatic embodiments. In one manual embodiment, the loader is an arm assembly which employs an articulated arm having a plurality of segments to position the stiffener in the prober. A hand is coupled to the arm for holding the stiffener, the second alignment pins being located on the hand. A handle is coupled to the arm facilitating manual manipulation of the arm assembly, and thereby positioning of the stiffener in the prober.

In an automatic embodiment, the loader is an arm assembly which automatically moves the stiffener in first and second directions, the first direction being substantially parallel to the plane defined by the upper surface of the stiffener, and the second direction being substantially perpendicular to the upper surface plane. The arm assembly includes a Z mechanism coupled to the prober. A first slide assembly is coupled to the Z mechanism. A first air cylinder is coupled to the first slide assembly. A second slide assembly is coupled to the first air cylinder. A second air cylinder is coupled to the second slide assembly. A hand is coupled to the second air cylinder for holding the stiffener, the second alignment pins being located on the hand. The first air cylinder moves the second slide assembly with respect to the first slide assembly in the first direction. The second air cylinder moves the hand with respect to the second slide assembly in the first direction to a position directly below the theta ring. The Z mechanism moves the arm assembly in the second direction, thereby causing the first alignment holes to engage the first alignment pins on the theta ring Each of the above described embodiments may also include a touch memory associated with, attached to, or embedded in the stiffener. The touch memory stores a variety of operational data regarding the probe card held in the stiffener. When the touch memory comes into contact with a memory reader, operational data may be read from and written to the touch memory. In one manual embodiment, a memory reader on the hand makes contact with the touch memory when the stiffener is loaded on the hand. In an automatic embodiment, a rack of stiffener storage shelves has a memory reader on each shelf. When the arm assembly replaces a stiffener on one of the shelves, the memory reader on that shelf makes contact with the touch memory.

A further understanding of the nature of the invention may be realized by referring to the remaining portions of the specification and the drawings.

BRIEF DESCRIPTION OF THE DRAWINGS

FIG. 3c is a bottom view of the theta ring assembly;

FIG. 5 is a perspective view of another embodiment of the invention;

FIGS. 14a, 14b–18 illustrate a process for operating the AutoLoader 3A in a series of logical flowcharts.

DESCRIPTION OF SPECIFIC EMBODIMENTS

Two specific embodiments of the method and apparatus of the present invention are described herein with reference to the above-described figures. A manual embodiment will be described first with reference to the terms defined below.

Figure 1:
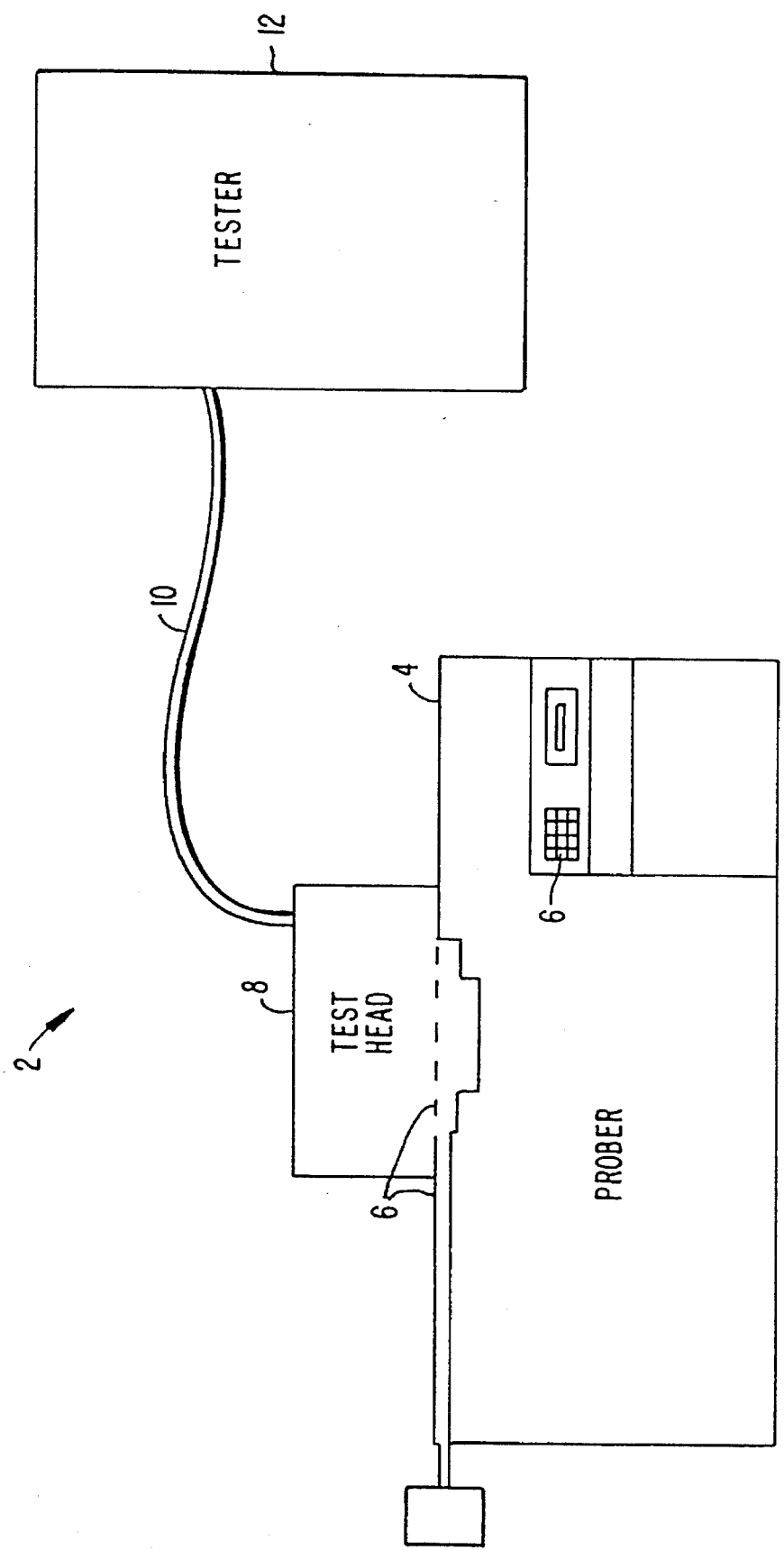
FIG. 1 is a system block diagram of a wafer test system incorporating an AutoLoader designed according to the present invention.

FIG. 1 is a system block diagram of a wafer probe system incorporating an Autoloader designed according to either of the embodiments of the present invention described below. The system 2 includes a prober 4, which includes the prober to test head interface (AutoLoader) assembly 6. Prober 4 contains mechanical elements for moving wafers into position for testing, and various associated testing and control electronics of the type known to those of skill in the art. Autoloader 6 serves as an interface between prober 4 and a test head 8.

Attached to test head 8 is a floating contactor assembly, commonly referred to in the industry as a "Pogo stack" (not shown). The floating contactor comprises "Pogo pins" which make contact with the wafer probe card being used, and are the means by which signal are applied to and data retrieved from the probe card. In order to be coupled to the Pogo pins, the probe card must be positioned with respect to test head 8. When in position, the probe card, with probing points extending downwards, is then made to make contact with a wafer (not shown) and appropriate signals are applied thereto. The responses of the various dies on the wafer are then monitored and recorded.

Test head 8 is connected by various conductors 10 to a tester 12. Tester 12 contains the necessary computer processing facilities to direct the application of test signals to the wafer or device under test (DUT), and further to record and interpret the responses of the wafer to the signals.

In specific embodiments of the present invention, the prober-to-test head interface system comprises a transport assembly which positions the probe card stiffener into a working test position. The "AutoLoader 3M" facilitates the manual loading and unloading of probe cards. A prober 200 with loading arm 202 attached thereto is shown in FIG. 2.

Figure 2:
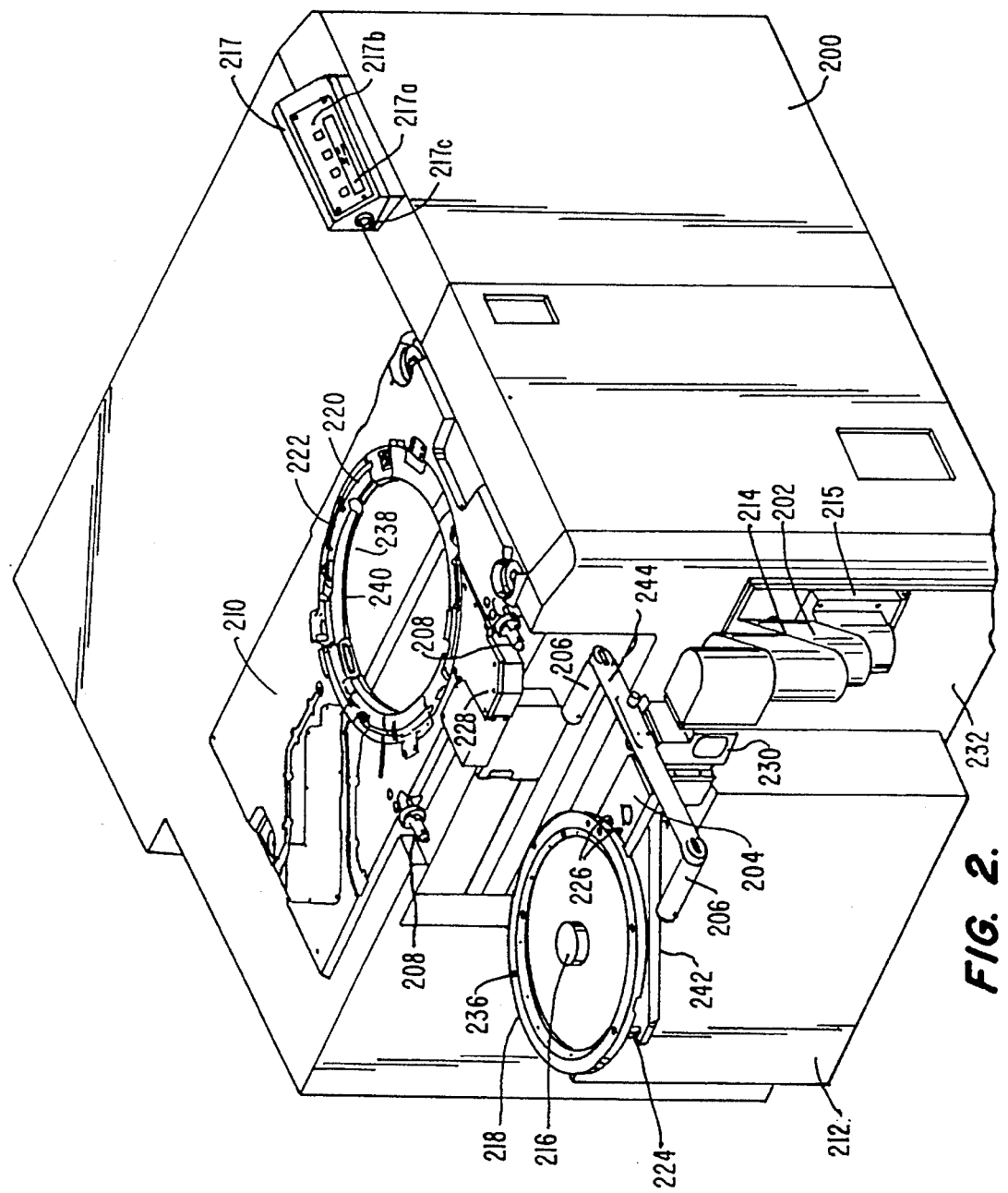
FIG. 2 is a perspective view of one embodiment of the present invention.

The following terms will be defined with reference to FIGS. 2–4. The "arm" 202, shown in FIG. 2, allows manual loading and unloading of probe card stiffeners into prober 200, through a door in the left side of the prober. Attached to the end of the arm is a "hand" 204. Behind hand 204 is the assembly of handle 244 and the arm alignment tubes 206 which are used together to align arm 202 to the docking pins 208 on the left side of the ring carder 210. Arm 202 resides next to the system controller 212 and both are attached to the mounting plate 232 which is bolted to the prober frame. The joints 214 in arm 202 provide the freedom of motion needed to insert and retrieve probe card 216 in its stiffener 218 into and from "theta ring" 222. The joints 214 are attached to the shoulder 215 for adjustments in pitch, roll and Z.

The "contactor" (not shown) is an electro-mechanical device responsible for test signal transmission through probe card 216 to the device under test (DUT). The contactor uses coaxial cable, Pogo pins, and the probe card itself as the transmission elements.

The "control panel" 217 is the user interface for the AutoLoader 3M which is connected to the system controller 212. It displays menus and options on an LCD 217a with two lines of 40 characters each. The control panel has a four pushbutton keypad 217b with indicator lights to aid in the selection process and a theta adjust knob 217c.

Figure 3A:
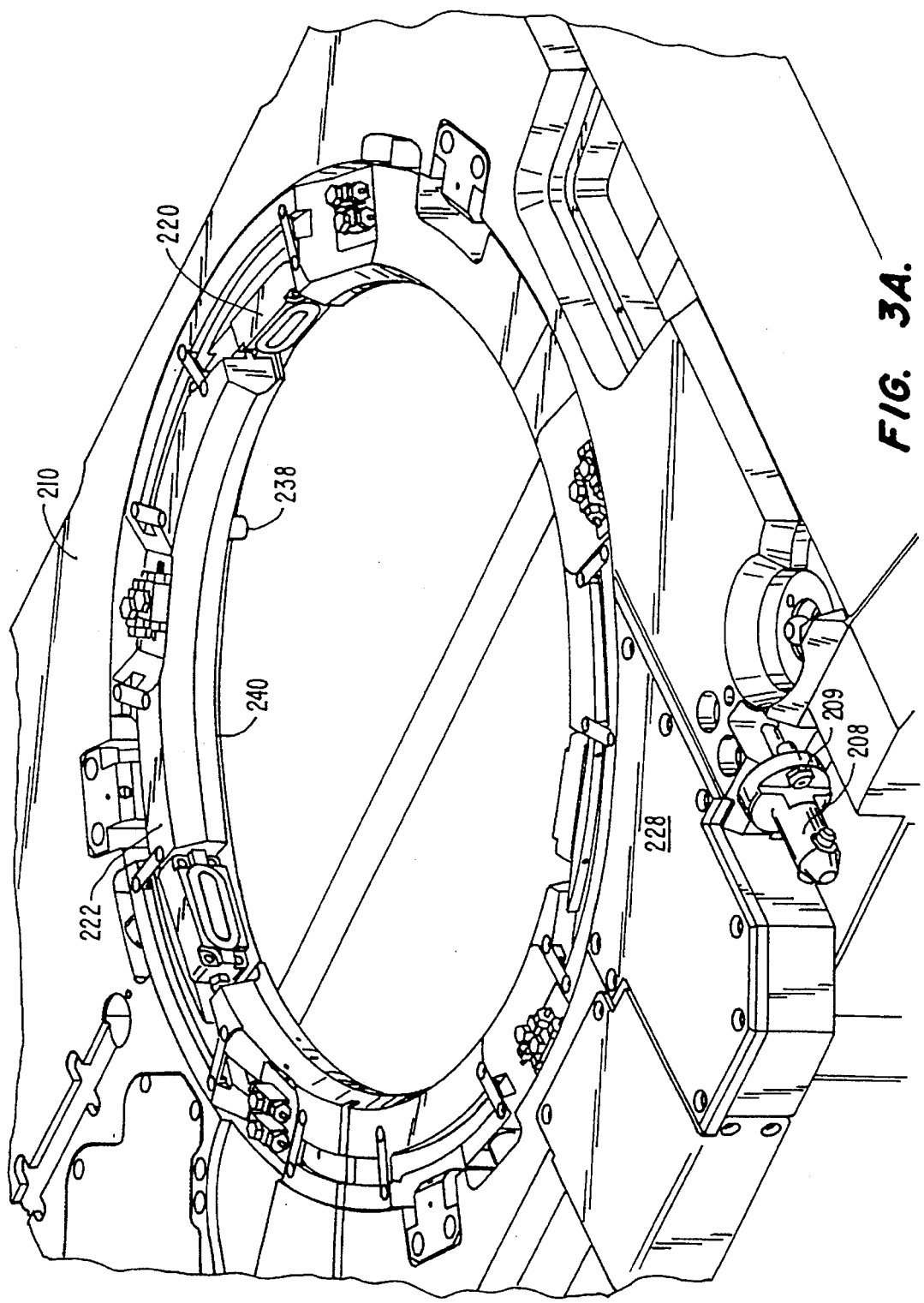
FIG. 3a is a perspective view of a theta ring assembly in one embodiment of the invention.

Referring now to FIG. 3a, the "contactor clamp cylinders" 220 are three air-driven clamps which are used to lock the contactor in theta and Z during a probe card swap.

The "contactor guide pins" (not shown) are three pins which protrude from the prober side of the contactor to align the contactor to the probe card.

The "die interface" (not shown) comprises tungsten probes or membrane "bumps" which make physical and electrical contact to the device under test.

Figure 4A:
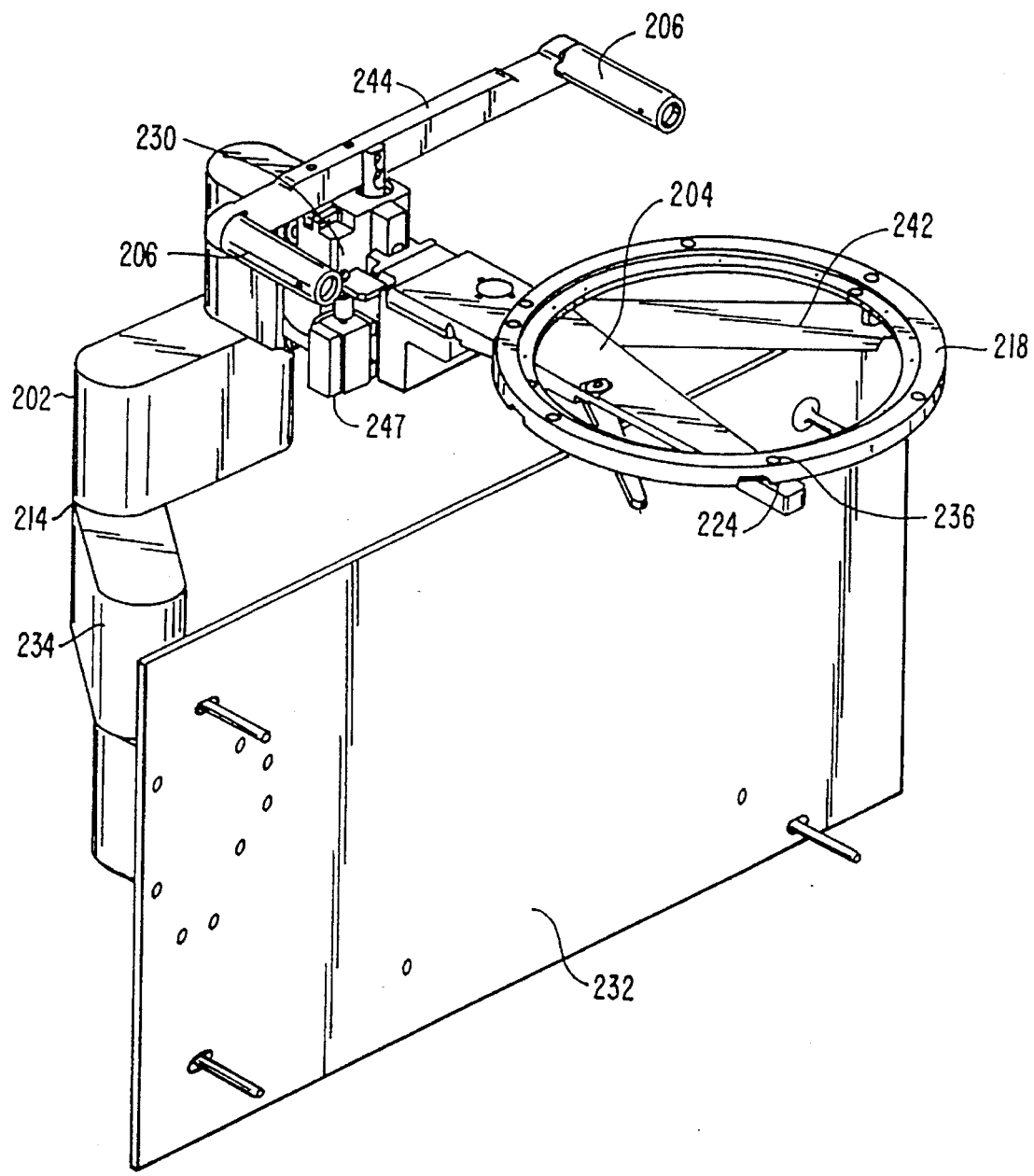
FIG. 4a is a drawing of the stiffener transport assembly for one embodiment of the invention.
Figure 4B:
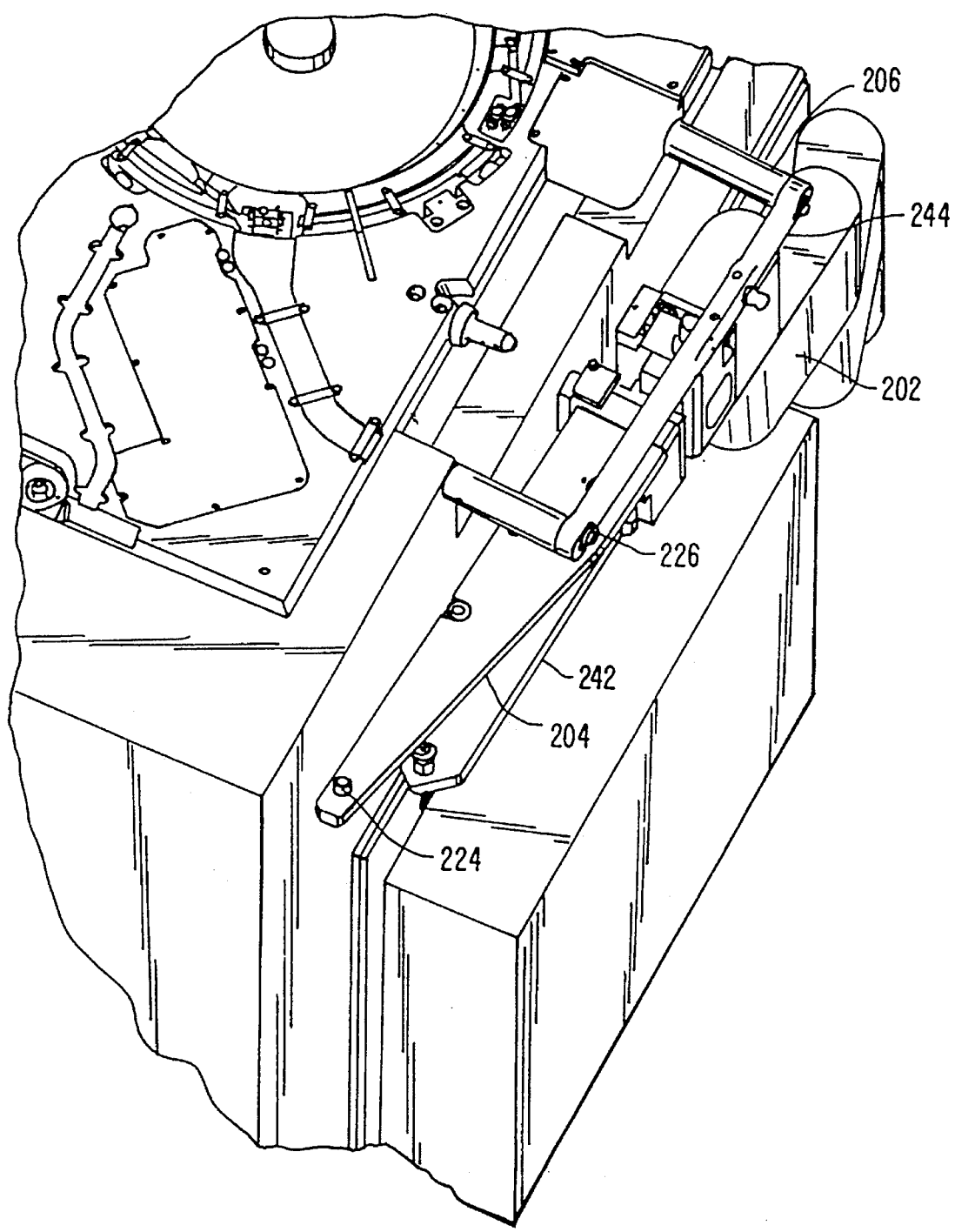
FIG. 4b is a top view of the stifleher transport assembly in its storage position.

Referring now to FIG. 4a, the "hand" 204 is attached to the end of arm 202 and carries probe card stiffener 218 between the theta ring 222 and the outside of prober 200 (see FIG. 2). It has three adjustable pins 224 which insert into stiffener 218 for alignment and leveling. It also includes a touch memory read/write station 226. FIG. 4b shows the arm assembly in its storage position against the side of prober 200.

Referring back to FIG. 2, the "ring carrier" 210 is the top plate of prober 200, and contains the interface to the test head and the theta drive 228.

Figure 3B:
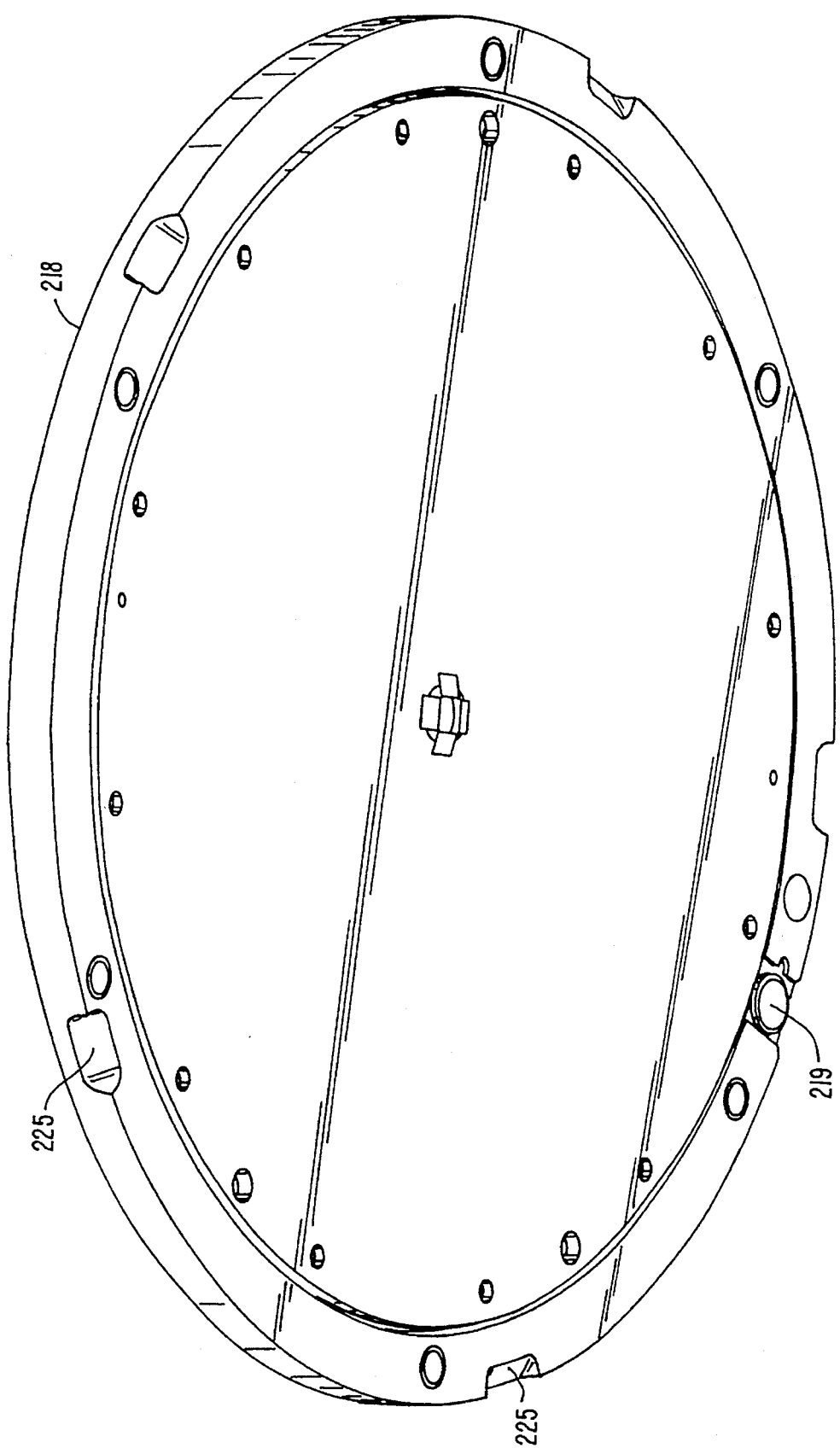
FIG. 3b is a bottom view of a probe card stiffener.

The "stiffener" 218 mounts to and provides structural stiffness to probe card 216. A touch memory 219 is permanently attached to the bottom of each stiffener 218 as shown in FIG. 3b, a bottom view of stiffener 218. Stiffener 218 also has a several recesses 225 in its underside around its perimeter.

FIG. 3c shows a bottom view of theta ring 222. The "stiffener lock ram cylinders" 221 are air cylinders facing inward around the periphery of theta ring 222, used to lock stiffener 218 in the working position in theta ring 222. Rollers 223 on the end of the air cylinder shafts provide non-galling contact with the stiffener at recesses 225.

The "system controller" 212 is a PC-clone-based controller which is bolted to the left side of prober 200.

The "theta drive assembly" 228 is a stepper motor assembly which rotates probe card 216 in order to align the probe tips to the device under test pads. Theta drive assembly 228 of the present invention allows for fast probe-to-pad alignment by recalling theta offset data from previous uses of a specific probe card stored in the touch memory. Operators can also manually set the theta angle by rotating the theta adjust knob on the control panel. The new theta offset adjustment will be automatically stored in the touch memory for the next time the probe card is used.

The "theta ring" 222 is the adapter between ring carrier 210 and stiffener 218 which provides for the theta orientation of probe card 216.

The "theta offset" is the difference in angular orientation probe card 216 between its working location where it is properly aligned, and the orientation at which it is inserted into theta ring 222. The theta offset is stored in the touch memory and can be recalled and automatically corrected each time a probe card is loaded.

The "touch memory" 219 is a watch-battery-sized device which contains a real-time clock and 4,096 bits (512 bytes) of non-volatile RAM. The touch memory is used to store probe card usage information, and is mounted on the lower surface of stiffener 218, flush with the stiffener's bottom.

The "touch memory read/write station" is located on hand 204 and makes electrical contact with the touch memory for serial communications with system controller 212.

The "wrist" 230 (FIG. 4a) is coupled to arm 202 and accommodates an anti rotation pin mounted in handle 244 (not shown) which secures the handle in the load/unload position., This pin is spring loaded and can be disengaged from the wrist for rotating the handle to parallel position with respect to the arm during storage.

The "X", "Y", "Z", and "theta" directions are relative to the center of the probe card as viewed from the front of the prober. Positive "X" is motion to the right; positive "Y" is motion away from the operator; positive "Z" is vertical motion up from the ring carrier, and "theta" is angular motion around the Z-axis.

The system comprises the following subsystems. The arm assembly comprises arm 202 and hand 204. Arm 202 is mounted on a shoulder 215 which is bolted to the prober frame. Shoulder 215 has pitch and roll adjustments (±3 degrees for each), as well as a one quarter inch "Z" adjustment. Arm 202 consists of three links 234 which allow manual alignment of probe card stiffener 218 into ring carrier 210. Handle 244 has 90 degrees of rotation to allow for storage (FIG. 4b), but has a spring loaded pin to positively lock it into position. Hand 204 has approximately 1¼"" of air powered "Z" travel, tiding on a linear bearing for guidance. Hand 204 is affixed to the end of arm 202 and moves with it. Hand 204 has three pins 224 which hold probe card stiffener 218 in the correct orientation while being transported. There is a touch memory read station 226 (see FIG. 2) on hand 204 for communicating with touch memory 219 mounted on the bottom of stiffener 218. Arm 202 and hand 204 are designed to accommodate the combined weight of probe card 216 and stiffener 218.

Stiffener 218 is an anodized aluminum device which is affixed to probe card 216. Alignment of probe card 216 to stiffener 218 is established by two close-tolerance pins which are pressed into stifleher 218 and pass through two close-tolerance holes in probe card 216. Stiffener 218 carries a touch memory affixed thereto which contains the history, the theta offset, and any other pertinent data regarding probe card 216 stored therein. Stiffener 218 has six close-tolerance alignment holes 236, three of which are used to position stiffener 218 relative to hand 204, and three of which are used to align stiffener 218 with theta ring 222. Stiffener 218 also has close-tolerance holes which engage guide pins on the contactor, thereby aligning the contactor assembly to probe card 216.

Theta ring 222 resides in the central hole in ring carrier 210. It defines the location in "X", "Y", theta, and "Z" for stiffener 218, and provides mounting for contactor clamp cylinders 220. The stiffener lock ram cylinders 221 (FIG. 3c) are built into the lower edge of theta ring 222. Close-tolerance pins 238 in theta ring 222 provide the "X", "Y" and theta alignment of stiffener 218 to theta ring 222. The Z-stop 240 is a machined lip in theta ring 222, against which stiffener 218 is forced by the stiffener lock ram cylinders 221.

The Theta drive 228 has a motorized metal belt drive which provides the force needed to rotate theta ring 222 around the test head Z-axis (i.e., in theta). The theta drive belt is connected to theta ring 222 by a single screw (not shown). Them drive assembly 228 includes the theta drive frame, the theta drive motor with encoder, the theta drive cover, the drive assembly and the theta drive electronics. The stiffness of ring carrier 210 is not adversely affected by the cut-out in which theta drive 228 is disposed. The operation of theta drive assembly 228 is as follows. Once the operator has pushed the "Load" button, controller 212 instructs the theta motor to turn in a specified direction until the theta drive position feedback encoder reports that theta ring 222 is aligned with the zero position (i.e., 0 m). Probe card stiffener 218 is installed by arm 202. The theta offset correction necessary for that particular probe card (information which was collected automatically upon last use of the probe card) is made without operator intervention. This provides rough probe-to-pad alignment.

Once the load process is complete the operator has the option of using the theta adjust knob on the control panel to turn theta drive 228, thereby turning theta ring 222, and thus probe card stiffener 218, to align the die interface with the device under test (DUT). There is an encoder which monitors the shaft on the theta motor to ensure positive positioning. The unload sequence is initiated by the operator pushing a button on the control panel to start the process. System controller 212 once again interacts with theta drive assembly 228 to drive it to the zero position. After the unload sequence is complete the theta motor is inoperative until the load sequence is initiated again.

System controller 212 consists of an IBM PC-Clone motherboard with an IDE hard/floppy disk and a dual serial port/single parallel port adapter cards; two 24 point digital I/O cards; a 256k VRAM VGA card; an IEEE-488 adapter card; and a single channel Quadrature Encoder Input Card. There are two separate power supplies in the controller; one for the PC motherboard and one to supply power for I/O and the stepper motors. All inputs to the PC are via opto-coupled circuitry, including communications links. All grounds are tied to a common frame point. The power coming into system controller 212 is RF-filtered with an industrial-grade filter network. Space is provided for solenoid-driven air control valves to control the pneumatic devices which move portions of the AutoLoader. System controller 212 has at least 10% extra, undedicated I/O, sufficient to handle both the current and future needs of the Autoloader. There is a guarded ON/OFF switch on the front face of controller 212.

The user interface for the AutoLoader is the control panel which has an LCD display, four pushbuttons, and a theta knob switch. Error messages will be sent over the IEEE 488 interface to the prober CRT. Testing and trouble shooting is facilitated by the capability of tying directly into the Autoloader controller with a keyboard and VGA screen.

To dock the test head to prober 200, a probe card 216 mounted in a stiffener 218 must be in place in theta ring 222. The test head is moved with the manipulator arm provided by the manufacturer to the correct location in X, Y and theta for docking. The test head is lowered until contact with probe card 216 has been achieved, as verified by the contactor sensors. The contactor vacuum is then turned on, and the contactor is pulled down onto probe card 216, compressing the utility and signal pins.

Once the test head contactor is docked, probe card 216 and stiffener 218 may be removed in the following manner. First, the operator pushes the lighted "Unload" button on the control panel. The AutoLoader asks (over the IEEE-488 link) if the tester is currently running a testing program. If it is not, the AutoLoader sends a command to prober 200 to move the forcer to a safe, out-of-the-way position. If the tester is testing, the operator will be informed that the tester is not willing to relinquish control at this time, and the AutoLoader will return to its "test program running" mode. If the tester is not testing, theta drive 228 rotates theta ring 222 from the last theta offset position to the theta zero position. The AutoLoader will request that the tester turn off the contactor vacuum. This allows the utility and signal pin forces to drive the contactor up, off of probe card 216. The vacuum seal foam gasket will still be sufficiently compressed to allow re-application of vacuum.

When the tester confirms that the vacuum has been turned off, contactor clamp cylinders 220 are extended, locking the contactor in "Z" and theta. At this point in the process the contactor guide pins are still engaged in stiffener 218, so it (the contactor) cannot move out of alignment. The control panel then displays a message letting the operator know it is safe to proceed, and a green light on the side of controller 212 comes on. The operator unfolds arm 202 from its storage position, and rotates the hand "finger" 242 to its working orientation. The operator then grasps the handle 244 on the arm assembly and pushes the hand through the prober left side door until the alignment tubes 206 on the handle dock against two alignment pins 208 attached to ring carrier 210. Hand 204 (and thus probe card 216 and stiffener 218) will now be positioned under theta ring 222.

The Autoloader detects that the arm assembly is in position to remove probe card 216 when switches 209 at the base of docking pins (one each) are tripped by the alignment tubes. The green lamp turns off the and the red lamp turns on, thereby warning the operator to wait and not move anything. The "Z" cylinder 247 in the arm "wrist" area lifts hand 204 up to the bottom of probe card 216. The stiffener ram lock cylinders (not shown) retract, releasing stiffener 218 onto hand 204. Hand 204 moves in the "Z" direction, removing probe card stiffener 218 from the interface. The touch memory is updated with usage and theta offset information by the touch memory read station. If this writing process is successful, the green lamp comes on, telling the operator that it is safe to remove the probe card from the hand. The operator pulls on handle 244 to bring the arm assembly back outside the prober left side door.

If the write process is unsuccessful, the yellow light flashes and the operator has to read the touchdown data from the control panel display and write it down. The operator will be given the opportunity to clean the touch memory contact surface and replace the probe card on the hand for another try at writing the data. Once a successful data write cycle occurs, the operator removes the probe card from the hand and stores the arm assembly against the left side of the prober unless the operator wishes to load another probe card.

A probe card 216 may be loaded in prober 200 in the following manner. This procedure assumes that the test head/contactor is already docked. The operator first pushes the lighted "Load" button on the remote control. The control panel displays a message telling the operator that it is safe to proceed. A green lamp lights on the controller adjacent the arm storage area. The operator unfolds arm 202 and rotates finger 242 and handle 244 to the working position. The operator then places probe card stiffener 218 on hand 204, automatically making the connection between touch memory read station and the touch memory mounted on the bottom of probe card stiffener 218. The touch memory read station polls the touch memory for the probe card serial number, usage data, and theta offset information which it temporarily stores in the RAM of the controller. If the data is not read successfully, the yellow light will flash, informing the operator that the read cycle was not completed successfully.

Once a successful read of the touch memory has been achieved, the operator grasps handle 244 on the arm assembly and pushes the hand through the prober left side door until the alignment tubes 206 on the arm docks against two alignment pins 208 attached to ring carrier 210. Hand 204 and probe card stiffener 218 are then perfectly positioned under theta ring 222. The AutoLoader 3M detects that the arm assembly is in position to insert a probe card when two switches 209 at the base of the alignment pins (one each) are tripped by the alignment tubes. The green lamp turns off and the red lamp turns on warning the operator to wait, and not to move anything. The AutoLoader retracts the ram lock cylinders 221, and engages the "Z" cylinder 247 on arm 202 to lift probe card stiffener 218 up into the interface.

When stiffener 218 is detected as being in place by a fiber-optic sensor in theta ring 222, the ram lock cylinders (not shown) extend, locking probe card stiffener 218 into place. "Z" cylinder 247 is then retracted (i.e., lowered), and the red lamp is turned off and replaced by the green lamp. Contactor clamp cylinders 220 then retract, freeing the contactor to move in "Z". The operator pulls the arm assembly out of the prober and folds it against the left side of the prober. The AutoLoader tells the tester to turn on the vacuum. The theta drive then rotates the theta ring to the theta offset position retrieved from the touch memory during the load cycle.

The "AutoLoader 3A", a different embodiment of the present invention, is for the automatic mechanized loading and unloading of probe cards. The Autoloader 3A has a magazine capable of holding two (or more) probe cards, and will be described with reference to FIGS. 5–8. A prober 400 with the magazine 402 attached thereto by docking hardware 404 is shown in FIG. 5.

Figure 6:
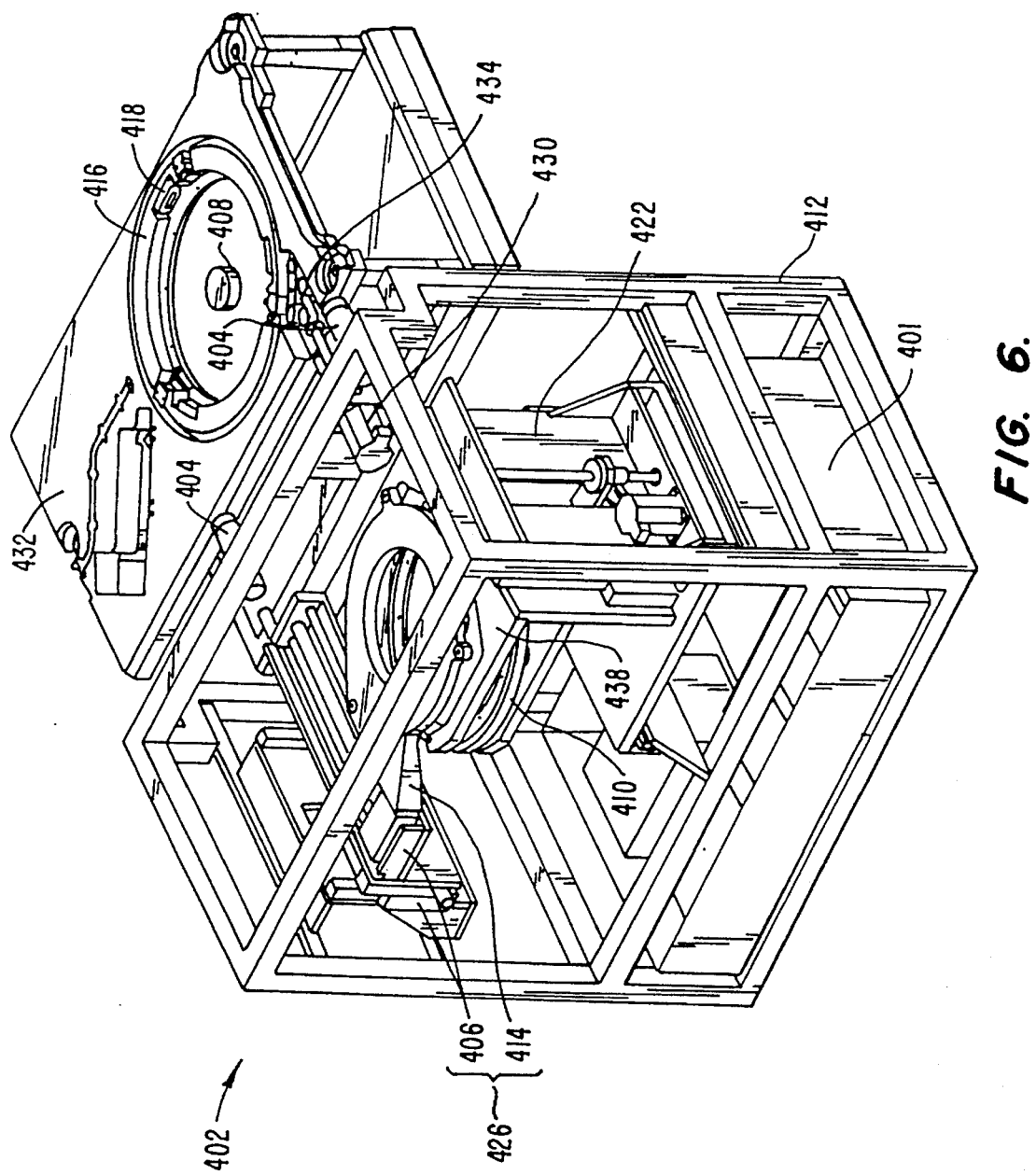
FIG. 6 is a different view of the embodiment of FIG. 5.
Figure 7:
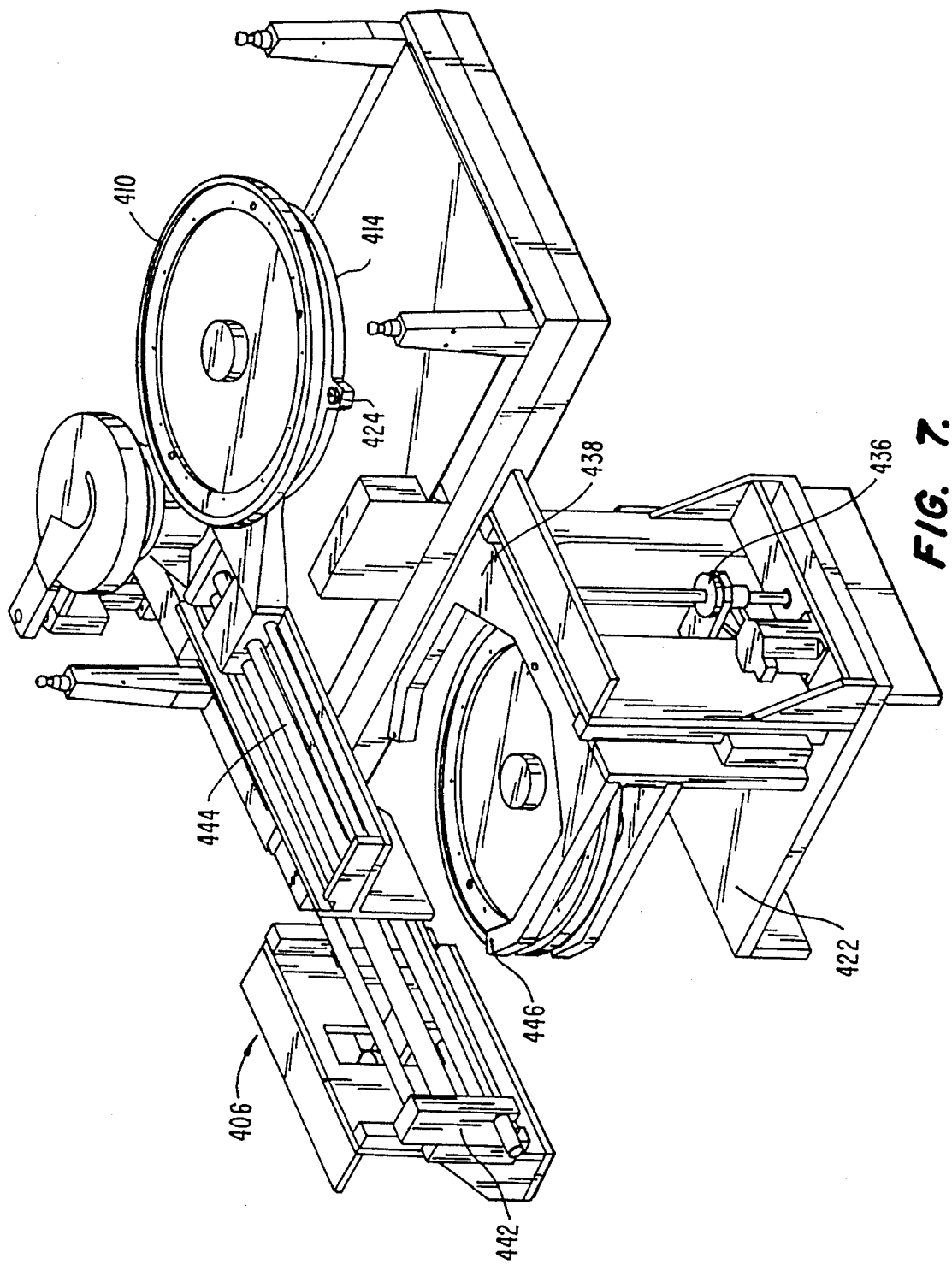
FIG. 7 depicts the probe card stiffener transport assembly and storage rack according to one embodiment of the invention.

The following terms will be defined with reference to FIGS. 6 and 7. The "arm" 406 carries the probe card 408 and the stiffener 410 between the prober 400 and the magazine 402. Arm 406 is attached to the magazine frame 412. The extension/retraction function of arm 406 is driven pneumatically. Arm 406 has a relatively small amount of "Z" motion capability which is used to transfer stiffener 410 between a hand 414 and a theta ring 416. "Z" motion is provided by a stepper-motor-driven screw (not shown).

The "contactor" (not shown) and "contactor clamp cylinders" 418 are as described above with reference to the Autoloader 3M.

The "die interface" (not shown) comprises probe pins or membrane "bumps" which make physical and electrical contact to the device under test.

The "hand" 414 is attached to the end of arm 406, and carries probe card stiffener 410 between the theta ring 416 and a rack 422. Hand 414 has three pins 424 which insert into stiffener 410 for alignment. Hand 414 and arm 406 form the arm/hand assembly 426.

The "magazine" 402 contains arm/hand assembly 426, rack 422, a system controller (401),. Magazine 402 is mounted on wheels and docks to the ring carrier 432 and prober 400. Separate umbilicals provide electrical, pneumatic, and digital connections between magazine 402 and prober 400.

The "motorized (stepper motor) probe card theta" or "theta drive" 434 rotates probe card 408 in order to align the die interface to the pads on the device under test. It allows for faster probe-to-pad alignment by recalling theta offset data from previous uses of a particular probe card recovered from a touch memory embedded in stiffener 410. Operators can also manually set theta angle by pushing buttons on the prober keypad.

The "rack" 422 is a storage area for probe cards 408 within magazine 402. Rack 422 has sufficient "Z" travel to permit arm 406 to come in under the next probe card which is to be carried into prober 400, and to then place the probe card onto hand 414. The "Z" motion is provided by a rack Z-drive 436 comprising a stepper-motor-driven screw which turns in a nut located in the moving portion of the rack.

The "rack shelf" 438 holds individual stiffeners 410. Each shelf has a touch memory read/write station on its upper surface (not shown).

"Ring carrier" 432, "stiffener" 410, "stiffener lock ram cylinders" (not shown), "system controller" 401, "theta ring" 416, the "theta offset", the "touch memory", the "touch memory read/write station", and the "X", "Y", "Z", and "theta" directions are substantially the same as described above with reference to the Autoloader 3M.

The Autoloader 3A system comprises the following subsystems. The transport assembly (shown in FIG. 7) comprises arm 406, rack 422, and hand 414, and is mounted inside magazine 402. The structure and operation of the transport assembly limits the potential for probe needle damage. Arm 406 consists of two air cylinder driven slides 442 and 444, mounted to one another to provide a telescoping action to move probe card stiffener 410 from magazine 402 into prober 400 and back. A stepper-motor-driven screw and nut combination (not shown) gives arm 406 the ability to move approximately 1" in the "Z" direction. This motion is used to place probe card stiffener 410 into the theta ring 416.

Rack 422 has two shelves 438 on which probe card stiffeners 410 are stored. Each shelf 438 has a touch memory read/write station for communicating with the touch memory mounted on stiffener 410. Each shelf 438 has three pins 446 which provide repeatable alignment of probe card stiffener 410. Rack 422 has sufficient "Z" travel to allow the hand-off of probe card stiffeners 410 from either of rack shelves 438 onto hand 414. This "Z" travel is driven by a motor-screw combination 436 similar to that used for arm 406.

Hand 414 is affixed to the end of arm 406 and moves with it. Hand 414 has three pins 424 which hold probe card stiffener 410 in the correct orientation while being transported between magazine 402 and prober 400. Arm 406 and hand 414 must be designed to accommodate the combined weight of the combination of probe card 408 and stiffener 410.

The stiffener/probe card assembly is substantially the same as described with reference to the Autoloader 3M.

Theta ring 416 resides in a central hole in ring carrier 432 (see FIG. 6). The purpose and function of theta ring 416 is substantially the same as described above with reference to Autoloader 3M.

The theta drive assembly 434 has a motorized metal belt drive which provides the push and pull needed to rotate the theta ring around the test head "Z" axis; i.e., in theta. The operation is as follows: Once the operator has pushed a prober keypad "hot key" to start a load sequence, or an IEEE-488 command has been received from the tester, the controller instructs theta motor 430 to turn in a specified direction until the theta drive position feedback encoder reports that theta ring 416 is aligned with the "home" or zero degree position. Probe card stiffener 410 is then installed using arm 406, as described below. The theta offset correction necessary for that particular probe card (information which was collected automatically upon first use of the probe card, and is automatically updated after each use) is made without operator intervention. This will provide probe-to-pad alignment. Once the load process is complete, the operator has the option of using the "hot key" push buttons on the prober keypad to turn theta drive 434, thereby turning theta ring 416 (and thus, probe card stiffener 410) to align the die interface with the device under test. The unload sequence can be initiated by either the operator by pressing a "hot key" on the prober keypad to start the process, or the tester over the IEEE-488 interface. The controller once again interacts with theta drive 434 to find the "home" position. After the unload sequence is complete, theta motor 430 remains inoperative until the load sequence is initiated again.

The theta drive assembly consists of the theta drive frame, the theta drive motor and the theta drive cover, the driver assembly, the theta drive connection (on the side of the ring carrier) and the theta drive electronics. As with the 3M embodiment, the stiffness of ring carrier 432 will not be adversely affected by the pockets necessary for the theta drive or the theta drive position feedback encoder.

The system controller is substantially the same as the controller described with reference to the 3M embodiment. Additionally, the user interface for the AutoLoader 3A is integrated into the RTM software running on the prober (controlling the user's interface/display). The AutoLoader communicates with RTM over a dedicated serial link. RTM will respond to dedicated "hot keys" on the prober keyboard, and send commands down the serial link to the AutoLoader 3A controller. One "hot key" will place RTM in a special terminal emulator mode, wherein the AutoLoader controller will take over all but the last two lines of the 25-line prober screen. In this mode, the following screens will be available: the Xandex Main Menu allows selection of the following screens, as well as displays the current theta offset, and enables keyboard-driven theta adjustment, probe card load, and probe card unload: the System Setup screen, the Diagnostics screen, and the Display Touch Memory screen.

Magazine 402 contains the stiffener transport assembly 426 and the controller 401. It is on spring-loaded casters, and has powder-coated external sheet metal. The sheet metal has been styled to have an appearance compatible with the prober design. There is an internal square tubular frame to which all major components are anchored. The magazine is docked to the ring carder via two spring-loaded docking pins. Two bayonet-style rotating receptacles 404 affixed to the magazine will lock to these pins. A third connection from magazine 402 to prober 400 is made to a point lower on the prober frame. This connection can be moved either closer or farther away from the magazine, thus rotating magazine 402 about a line passing through the upper docking pins. This allows for manufacturing variations from prober to prober, and fine alignment of the transport mechanism arm 406 and hand 414 to the theta ring 416. This adjustment will be retained when the magazine is pulled away and then restored to its docked position against the prober, and therefore needs only be made once per prober/magazine combination.

To dock the test head to prober 400, a probe card 408 mounted in a stiffener 410 must be in place in theta ring 416. Prior to docking, the contactor clamp cylinders 418 are in their normal retracted state. The test head is lowered down into the interface. The contactor is moved with the manipulator provided by the manufacturer to the correct location in "X", "Y" and "theta" for docking. The test head is lowered until contact with probe card 408 has been achieved, as verified by contactor sensors. The contactor vacuum is then turned on, and the contactor is pulled down onto probe card 408, compressing the utility and signal pins.

A loaded probe card is replaced in the Autoloader 3A embodiment in following manner. Arm 406 moves out of magazine 402, pushing the prober side door open, and positioning hand 414 below stiffener 410. Simultaneously, theta ring 416 rotates to the 0° or "home" position. Arm 406 and hand 414 then move up in "Z" and engage stiffener 410. Them ring 416 releases stiffener 410 (with probe card 408 attached) onto hand 414. Arm 406 and hand 414 then lower stiffener 410 down, out of theta ring 416. As this is taking place, rack 422 moves in "Z" to align empty probe card shelf 438 with incoming probe card 408.

Once stiffener 410 and probe card 408 are in place, securely mounted on hand 414, arm 406 retracts into magazine 402, inserting stiffener 410 and probe card 408 into the waiting empty slot in rack 422. Rack 422 moves up in "Z", lifting stiffener 410 and probe card 408 off of hand 414. When electrical contact has been made with the touch memory (mounted on the bottom of the stiffener), the touch memory is updated with the latest touchdown and other information. Once communication has been established between the Autoloader 3A controller and the touch memory, a green light on the outside of the magazine (one per rack shelf) lights, providing confirmation. Arm 406 then moves into prober 400, clear of rack 422.

Rack 422 moves again in "Z" to align the hand with the other stiffener 410 in rack 422. Arm 406 moves back into magazine 402, and rack 422 places the other probe card stiffener 410 onto hand 414 by moving in "Z". Arm 406 then moves into prober 400 carrying probe card stiffener 410 on hand 414. At the end of the arm's travel, arm 406 and hand 414 move in "Z" to insert probe card stiffener 410 into theta ring 416. Them ring 416 locks in stiffener 410, at which point arm 406 and hand 414 move down in "Z", and retract into magazine 402, storing hand 414 inside magazine 402 in the empty rack shelf 438 where the probe card currently in use previously resided. As arm 406 and hand 408 retract into magazine 402, the prober side door closes.

During the above-described procedure, the theta ring assembly and transport assembly components perform the following actions. Them drive 434 rotates theta ring 416 from the theta offset position for the loaded stiffener to the 0° position. The contactor vacuum is turned off, allowing the utility and signal pin spring forces to drive the contactor up, off of probe card 408. Contactor clamp cylinders 418 extend, locking the contactor in theta. At this point, the contactor guide pins are still engaged in stiffener 410 so it cannot move out of alignment.

Arm 406 moves out of magazine 402, as described above, to a position underneath theta ring 416. Hand 414 is brought up in contact with the bottom of stiffener 410. Stiffener lock ram cylinders (not shown) retract, releasing stiffener 410 onto hand 414. Arm 406 and hand 414 lower stiffener 410 down, out of theta ring 416, and carry it away. Probe card stiffener 410 is dropped off in rack 422, as described above, and the other stiffener 410 is picked up. The new stiffener 410 is brought out of magazine 402, into prober 400, and lifted up into theta ring 416 by hand 414. Guide pins in theta ring 416 engage matching holes in stiffener 410, aligning it in "X", "Y" and "theta". The stiffener lock ram cylinders (not shown) extend, forcing stiffener 410 up against the Z-stop surface of the theta ring, compressing the foam vacuum gasket of the contactor. Hand 414 then lowers and arm 406 retracts into magazine 402.

Contactor clamp cylinders 418 then retract, freeing the contactor in theta. The contactor vacuum is turned on, compressing the utility and signal pins, and locking down the contactor to probe card 408. Them drive 434 rotates theta ring 416 to the theta offset (stored in the touch memory) for the loaded probe card.

If the operator wishes to change out both probe cards in the magazine, the Xandex Menu Window is brought up on the prober display, and the operator initiates the Unload Probe Card sequence. The operator must confirm that the AutoLoader 3A has finished the operation before opening the magazine door by observing either the prober display or the flashing yellow light on the magazine (the light flashes when the AutoLoader 3A is busy). If the AutoLoader 3A is in operation, and the door is opened, the process underway is brought to a stop as quickly as possible. Recovery from this emergency stop (E-stop) state begins when the door is closed.

Figure 8:
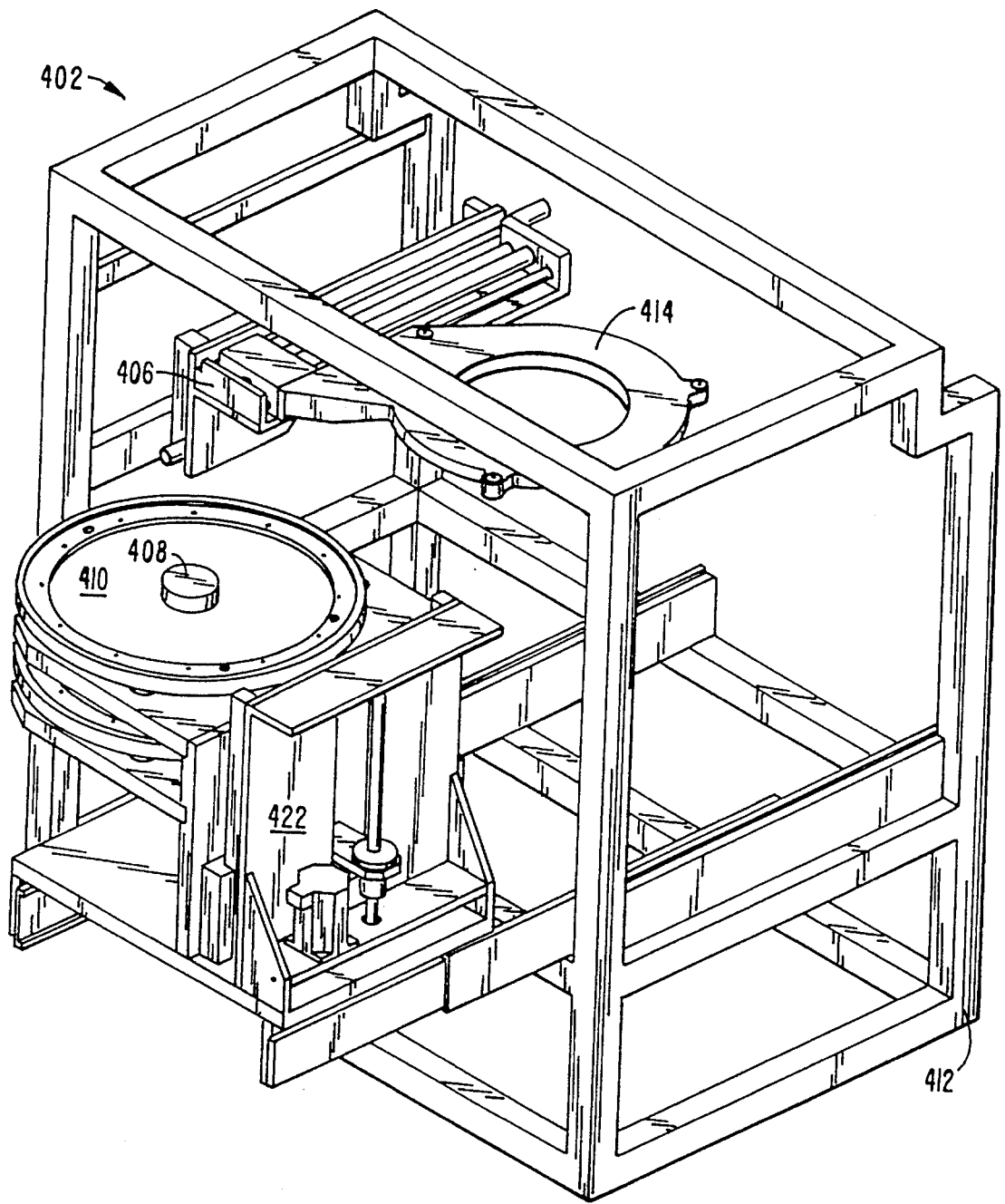
FIG. 8 illustrates the position of the stiffener rack in one embodiment for facilitating replacement of probe card stiffeners.

When the operator opens the door, rack 422 extends out of magazine 402 automatically to a position as shown in FIG. 8. This only happens as a consequence of having initiated the Unload Probe Card sequence. At this point, any probe card in the rack can be removed or installed as needed. As noted above, a lamp on the outside of the magazine provides visual feedback that the stiffener is correctly in place in its respective rack shelf, and that communication has been established with the touch memory on the bottom of the stiffener. Once the probe card replacement is complete, the operator pushes a button inside the cabinet to retract the rack, and closes the magazine door once the rack is fully inside.

As described above, the system and method of the present invention also comprise a probe card data collection system. In a specific embodiment, the individual probe cards are each provided with a corresponding memory. The memory is both writable and readable. The memory is mounted in a depression on the underside of the probe card stiffener in which the corresponding probe card is mounted. The memory may comprise erasable memory such as static random access memory (SRAM), or dynamic random access memory (DRAM) backed up by a power source, e.g., a battery. It should be apparent that write-only memories also may be used in some embodiments. In the embodiments described herein, the memory comprises a serial touch memory.

Since the touch memory is coded to an individual probe card, probe card performance and usage data may be easily tracked. It will be apparent that a wide variety of storage devices may be used without departing from the scope of the invention.

A variety of operational data about the probe card in the loader may be written to memory from a controller which is located in the transport assembly, via a touch memory data transfer device. Table 1 lists various types of operational data which may be recorded in the memory cell along with the source of the data.

TABLE 1

| Operational Data | Source of Data |
| --- | --- |
| Touchdowns | Loading assembly |
| Serial number | Input @ PC maint. station |
| Date of last maintenance | Input @ PC maint. station |
| Date of manufacture | Input @ PC maint. station |
| Failure nature of probes | GPIB-tester |
| Location of failed probes | GPIB-tester |
| Operators' I.D. | Loading assembly |
| Scheduled maintenance date | Input @ PC maint. station |
| Scheduled maintenance touchdowns | Input @ PC maint. station |
| Previous theta location | Input @ PC maint. station |

In one embodiment, a real time clock is incorporated into the key element for recording the times at which the corresponding probe card is used, as well as for recording the times when the probe card is checked or repaired.

The memory described herein with respect to various embodiments of the invention is useful for storing information about the number of times a particular probe card has made contact with wafers (touchdowns) since it was last serviced. Other important information which may be stored in the memory includes the number of failed contacts of individual or groups of probes and their locations, the probe card serial number, the date of the card's last maintenance, or the like. The memory feature described herein allows the system user to read maintenance information for a particular probe card, thereby enabling the user to identify probe cards which have been used extensively or which have exhibited unacceptable failure rates. In this way, probe cards which should be serviced or replaced may be easily identified.

Figure 9:
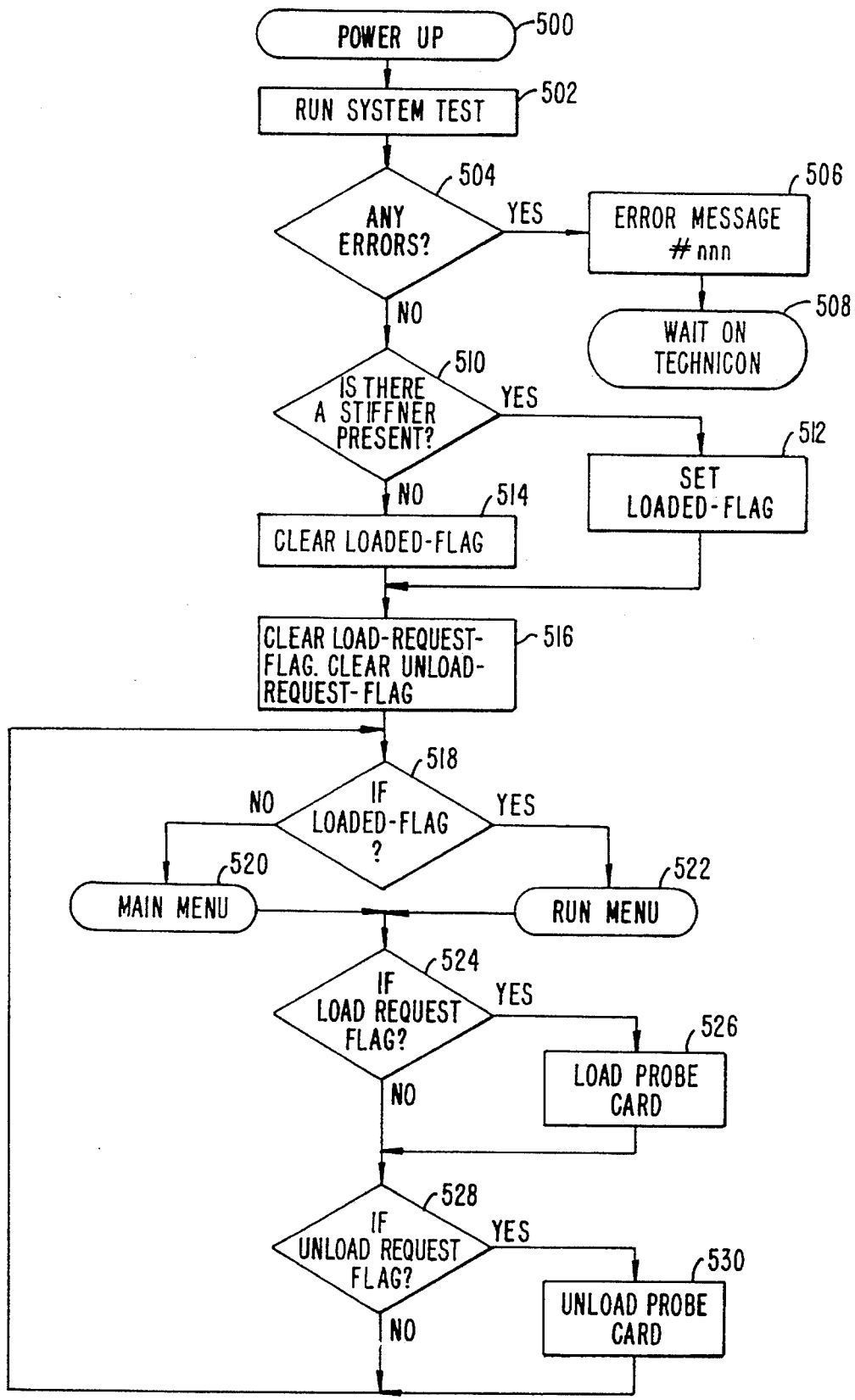
FIGS. 9–13 illustrate a process for operating the AutoLoader 3M in a series of logical flowcharts.
Figure 10:
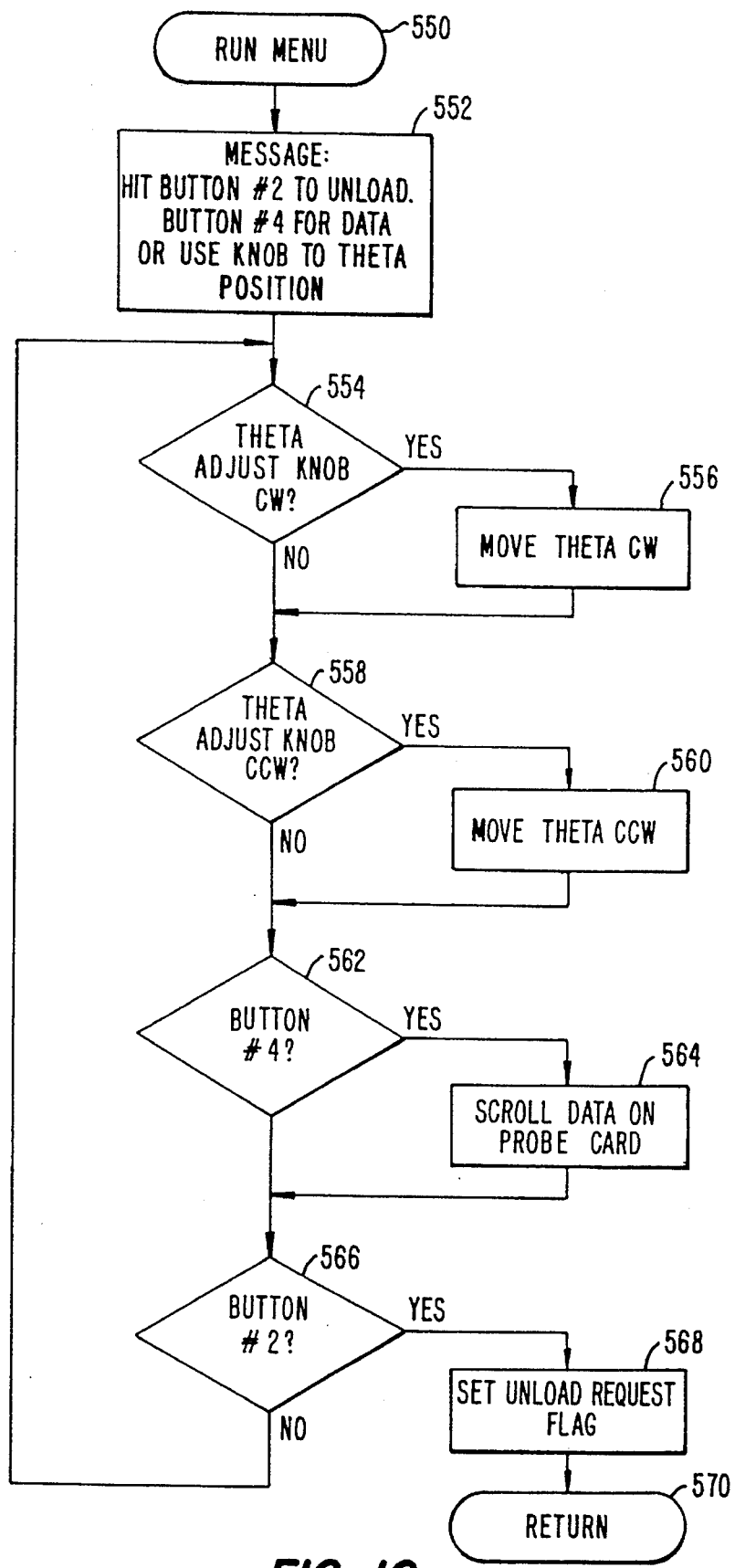
Figure 11:
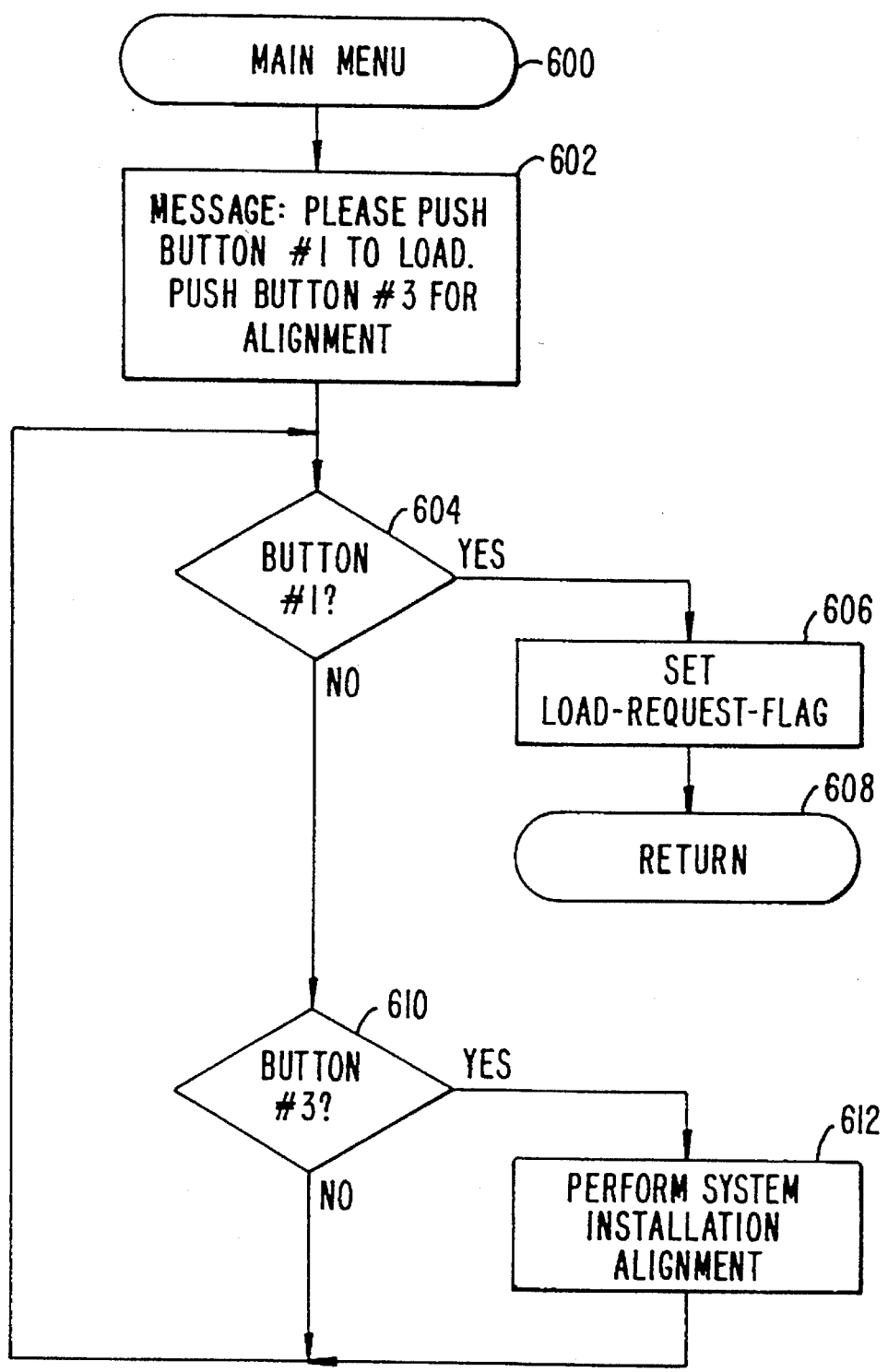
Figure 12:
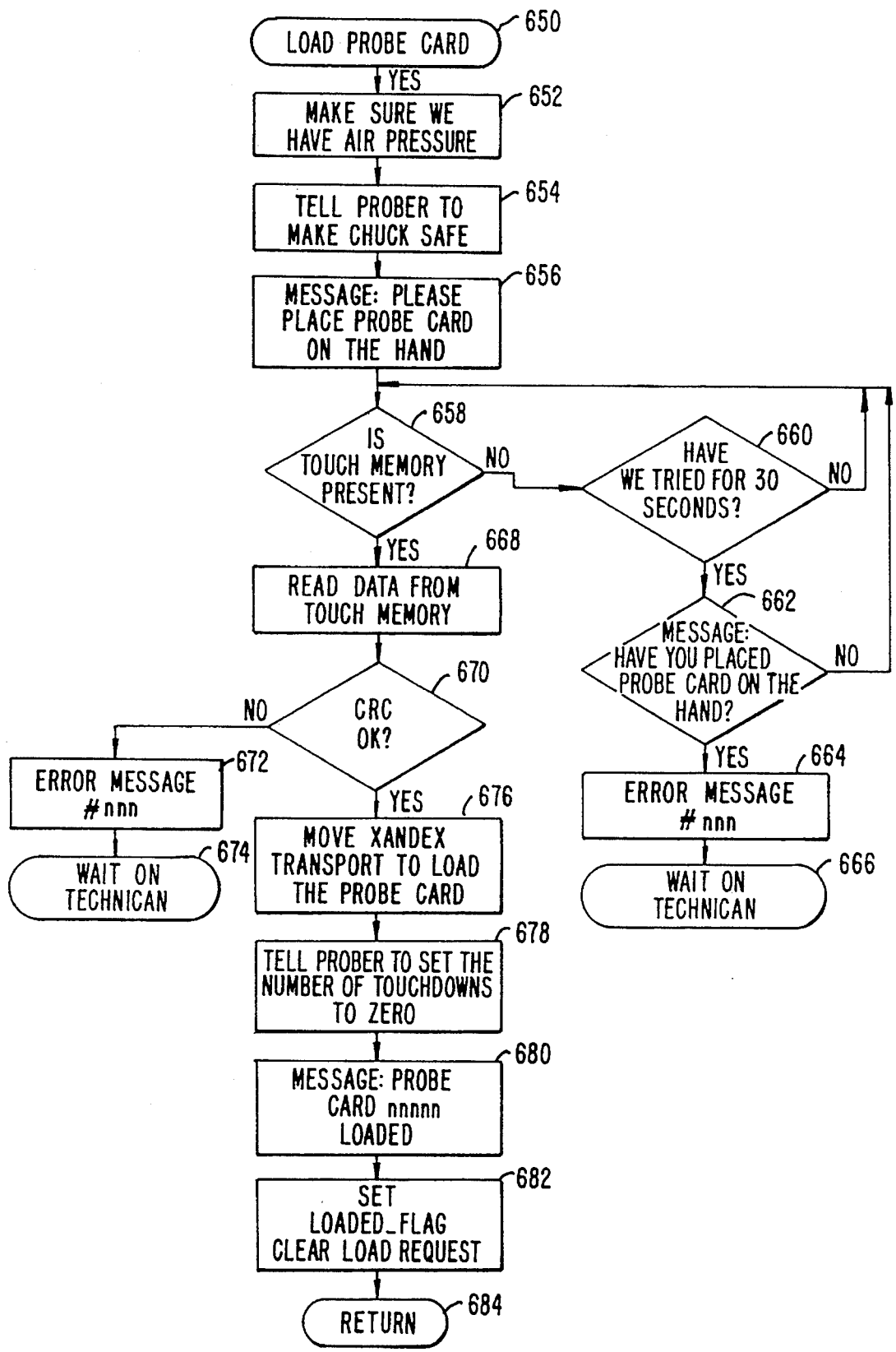

In FIGS. 9–13, a process for operating the Autoloader 3M is depicted in a series of logical flowcharts. At step 500 in FIG. 9, a power up sequence is initiated after which a system test is run at step 502. If any errors are detected in the system test, an error message is displayed and system operation is suspended. If no errors are detected, the system checks to see whether a stiffener is currently present in the prober (step 510). If a stiffener is present, a loaded flag indicating the presence of the stiffener is set. If no stiffener is present, the loaded flag is cleared. The system then clears both the load request and the unload request flags at step 516. At step 518, the system decides which of two menus to present to the operator. If the loaded flag was set at step 512, the system runs the run menu routine illustrated in FIG. 10. To begin the run menu routine, the system displays the message of step 552 which gives the operator the option of unloading the stiffener, reading the operational data for the loaded probe card, or adjusting the angular position of the theta ring with the theta adjust knob. The system then checks for movement of the theta adjust knob in either the clockwise or counter-clockwise directions, moving the theta ring accordingly. If the operator pushes button #4, the system displays and scrolls the stored operational data (steps 562 and 564). If the operator pushes button #2, the system sets the unload request flag and returns to the previous routine (FIG. 9).

If the loaded flag was cleared at step 514, the system runs the main menu routine (FIG. 11), which presents a message to the operator giving the option of loading a stiffener or aligning the system for installation (step 602). If the operator chooses the former and pushes button #1, the system sets the load request flag and returns to the previous routine illustrated in FIG. 9 (steps 604–608). If at step 610, the operator pushes button #3, thereby choosing the latter option, the system performs a system installation alignment at step 612. The system then waits for either button #1 or #3 to be pressed.

Once either the load request flag or the unload request flag has been set as described above, the system checks to see which flag has been set (step 518 of FIG. 9). If the load request flag has been set, the system performs the load probe card routine of FIG. 12. The system first checks for air pressure and then tells the prober to secure the test head for loading (steps 652 and 654). At step 656, the system prompts the operator to place a stiffener and probe card on the transport hand. The system then checks for the presence of the touch memory for the next 30 seconds, after which time, if no touch memory is detected, the system displays a message asking the operator if a stiffener has been placed on the hand. If the operator responds affirmatively, an error message is displayed and system operation is suspended (steps 658–666). If the operator responds negatively, the system checks for the presence of a touch memory for another 30 second period. Once the touch memory is detected, the system reads the operational data stored in the touch memory at step 668. The system then checks to see whether the cyclic redundancy check (CRC) is OK. If not, an error message to that effect is displayed, and system operation is suspended (steps 670–674). If the CRC is OK, the operator manually moves the articulated loading arm assembly into position below the theta ring at which point the system moves the arm vertically and loads the stiffener into the theta ring (step 676). The system then sets the touchdown count to zero, notifies the operator that the particular probe card has been loaded, sets the loaded flag, and clears the load request flag (steps 678–682).

Figure 13:
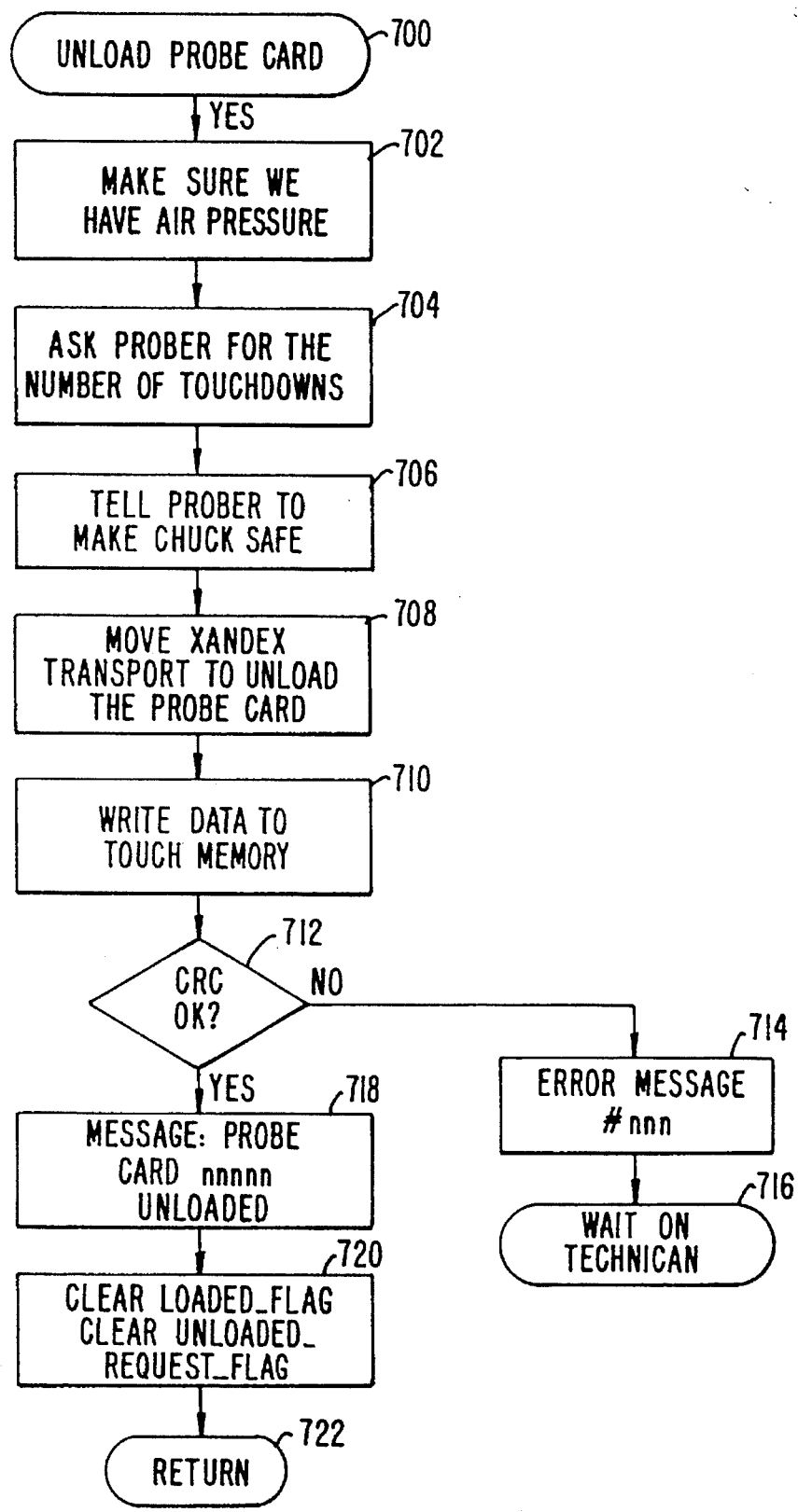
Figure 14A:
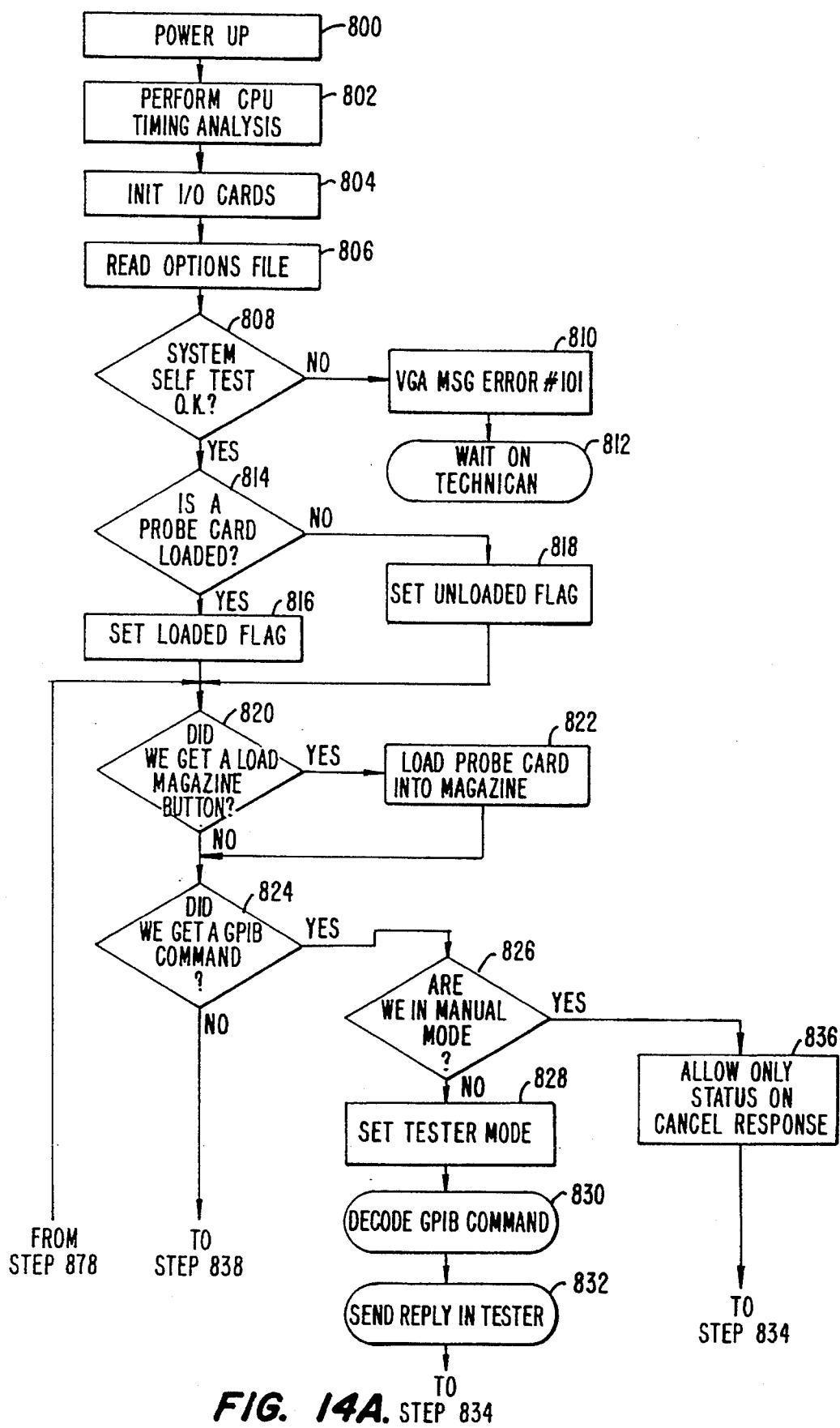
Figure 14B:
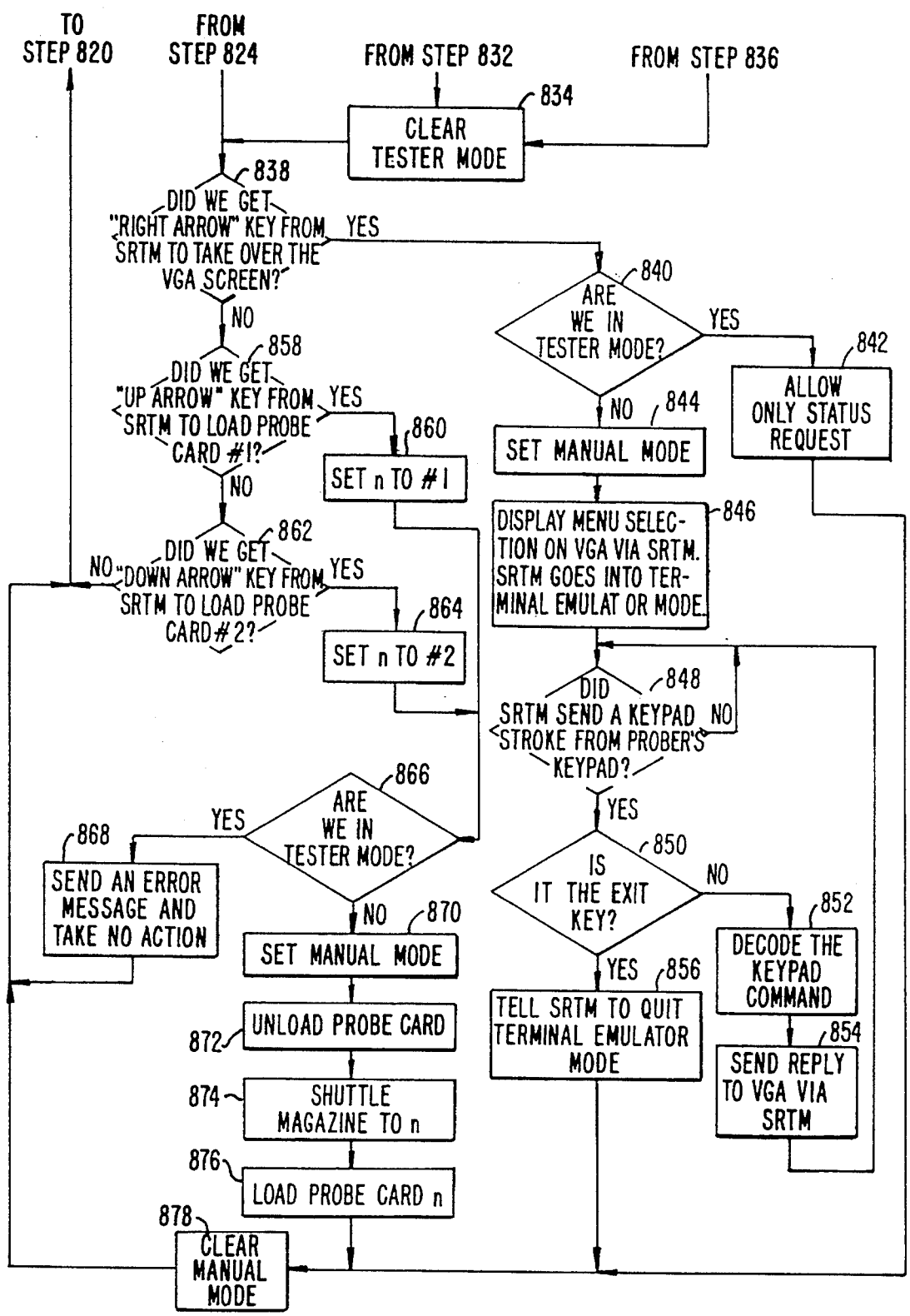

If the unload request flag has been set, the system performs the unload probe card routine of FIG. 13. The system first checks to see that air pressure is present (step 702). Then, at step 704, the system asks the prober for the touchdown count for the probe card. Once the test head is secured at step 706, the operator moves the articulated arm assembly into position to receive the stiffener and the probe card from the theta ring (step 708). Once the stiffener is loaded on the hand and the touch memory is in contact with the memory read station, operational data, including the number of touchdowns, may be written to the touch memory at step 710. The system then checks to see if the CRC is OK. If not, an error message to that effect is displayed, and system operation is suspended (steps 712–716). If the CRC is OK, the system notifies the operator that the particular probe card has been unloaded at step 718. The loaded flag and the unload request flag are then cleared at step 720.

Figure 15:
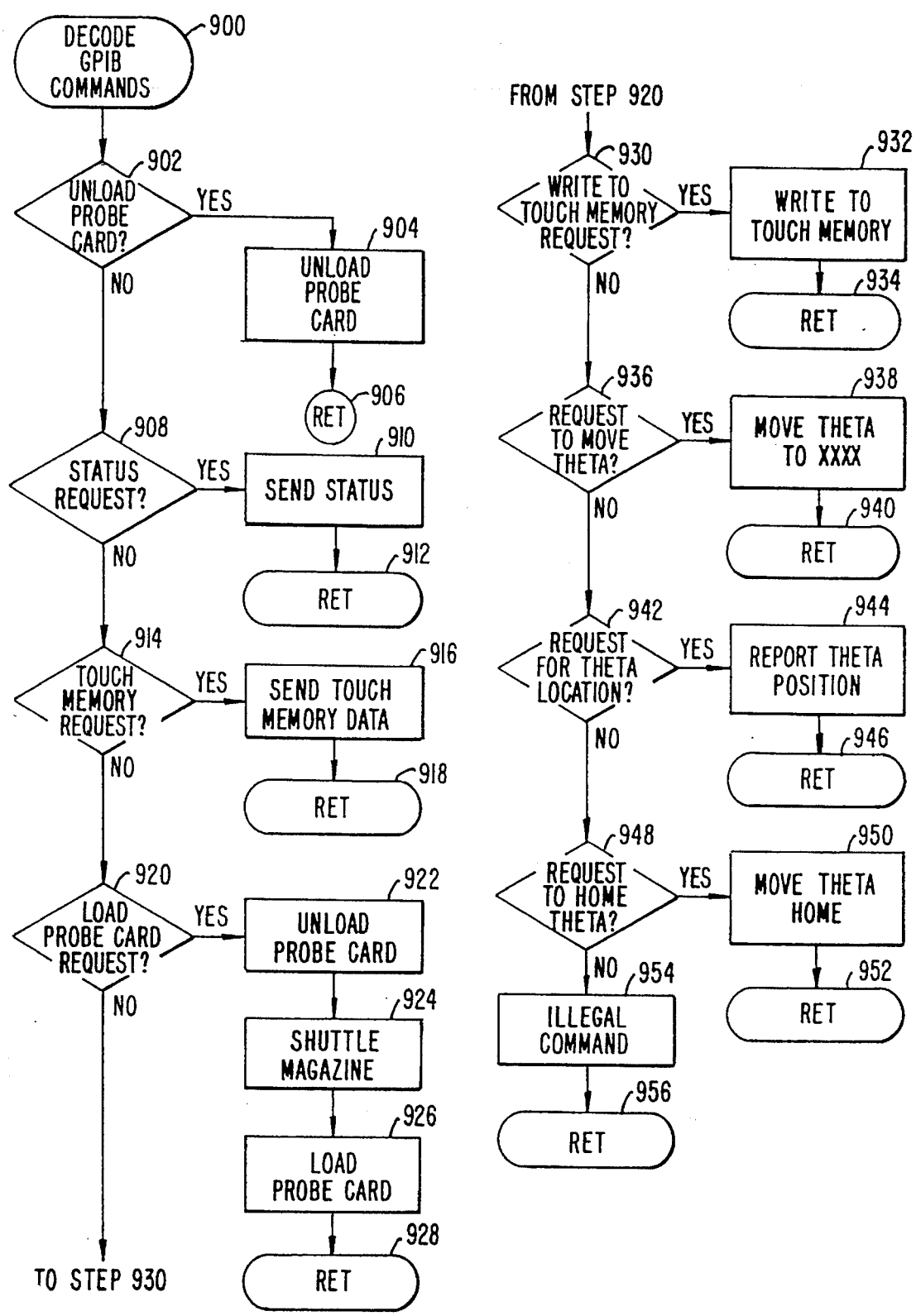

In FIGS. 14a, 14b–18, a process for operating the Autoloader 3A is depicted in a series of logical flowcharts. At step 800, a power up sequence is initiated after which a system test is run at step 808. If any errors are detected in the system test, an error message is displayed and system operation is suspended. If no errors are detected, the system checks to see whether a stiffener is currently present in the prober (step 814). If a stiffener is present, a loaded flag indicating the presence of the stiffener is set. If no stiffener is present, the loaded flag is cleared (step 818). The system then checks for a load magazine button at step 820. If the load magazine button had been pushed, the system runs a load magazine routine in which the operator may place new probe cards into the magazine. If the load magazine button was not pushed, the system checks for any commands from the GPIB (step 824) and decodes and executes the GPIB command if one is received (steps 826–834). The decode GPIB command routine (step 830) is illustrated in FIG. 15, and is responsible for, among other things, loading and unloading the probe card stiffener (steps 922–926 and 904), reading and writing touch memory data (steps 916 and 932), and moving the theta ring to and from the home position (steps 950 and 938).

Figure 16:
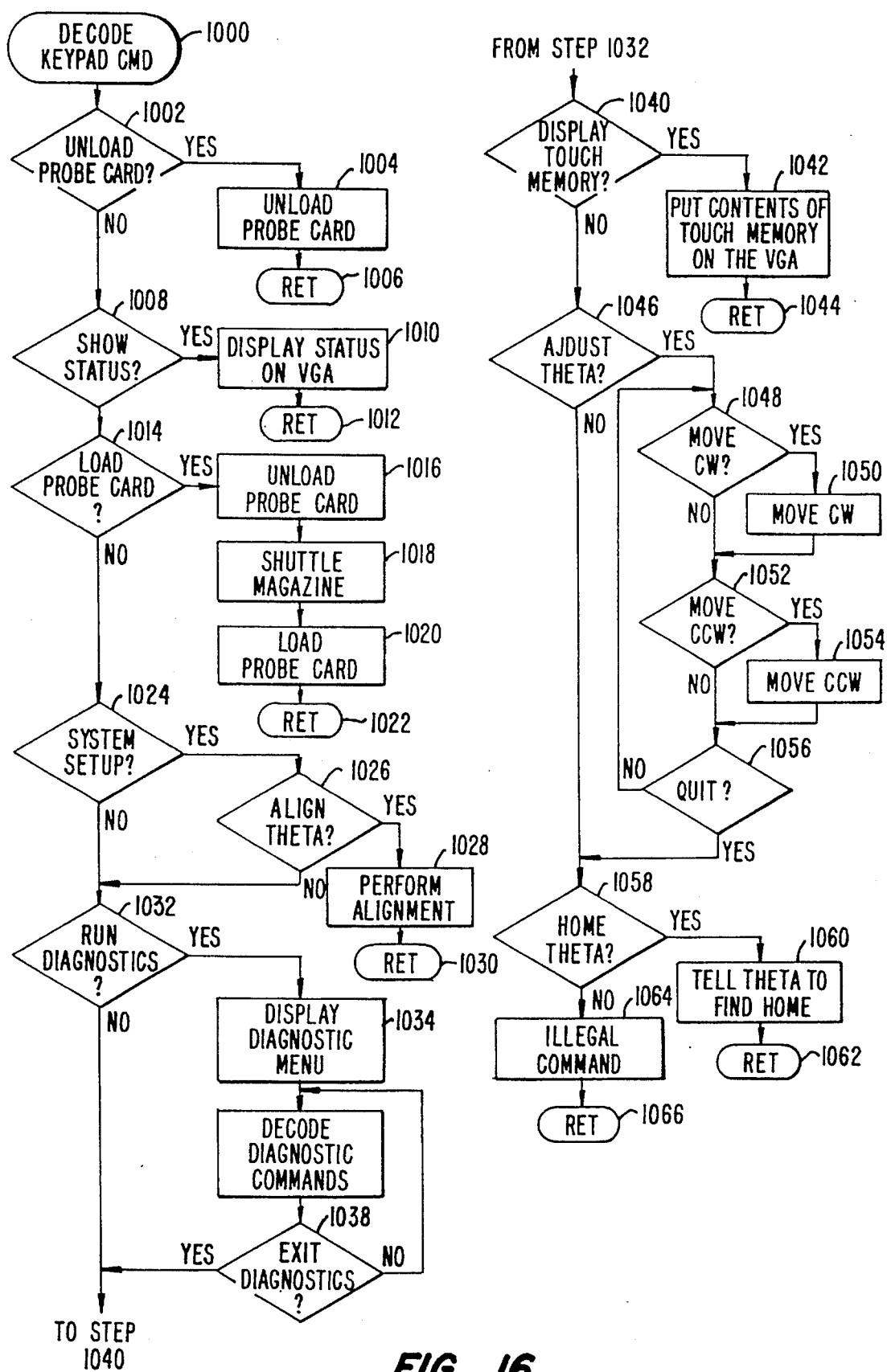

Referring again to FIGS. 14a–14b, if a GPIB command is not received, the system determines whether the operator has requested a manual mode (the terminal emulator mode described above) in which the operator may command various functions through the keypad. The decode keypad command routine (step 852) is illustrated in FIG. 16, and is responsible for, among other things, loading and unloading the probe card stiffener (steps 1016–1020 and 1004), displaying touch memory data (step 1042), and moving the theta ring to and from the home position (steps 1060 and 1048–1052). A diagnostics routine may also be run (step 1034–1038) in the decode keypad command routine.

If neither a GPIB command is received or manual mode is requested, the system checks whether specific commands to either load probe card #1 or probe card #2 from the magazine has been received (steps 858 and 862). If the system is not already in tester mode, manual mode is set and the appropriate probe card is loaded (steps 866–876).

Figure 17:
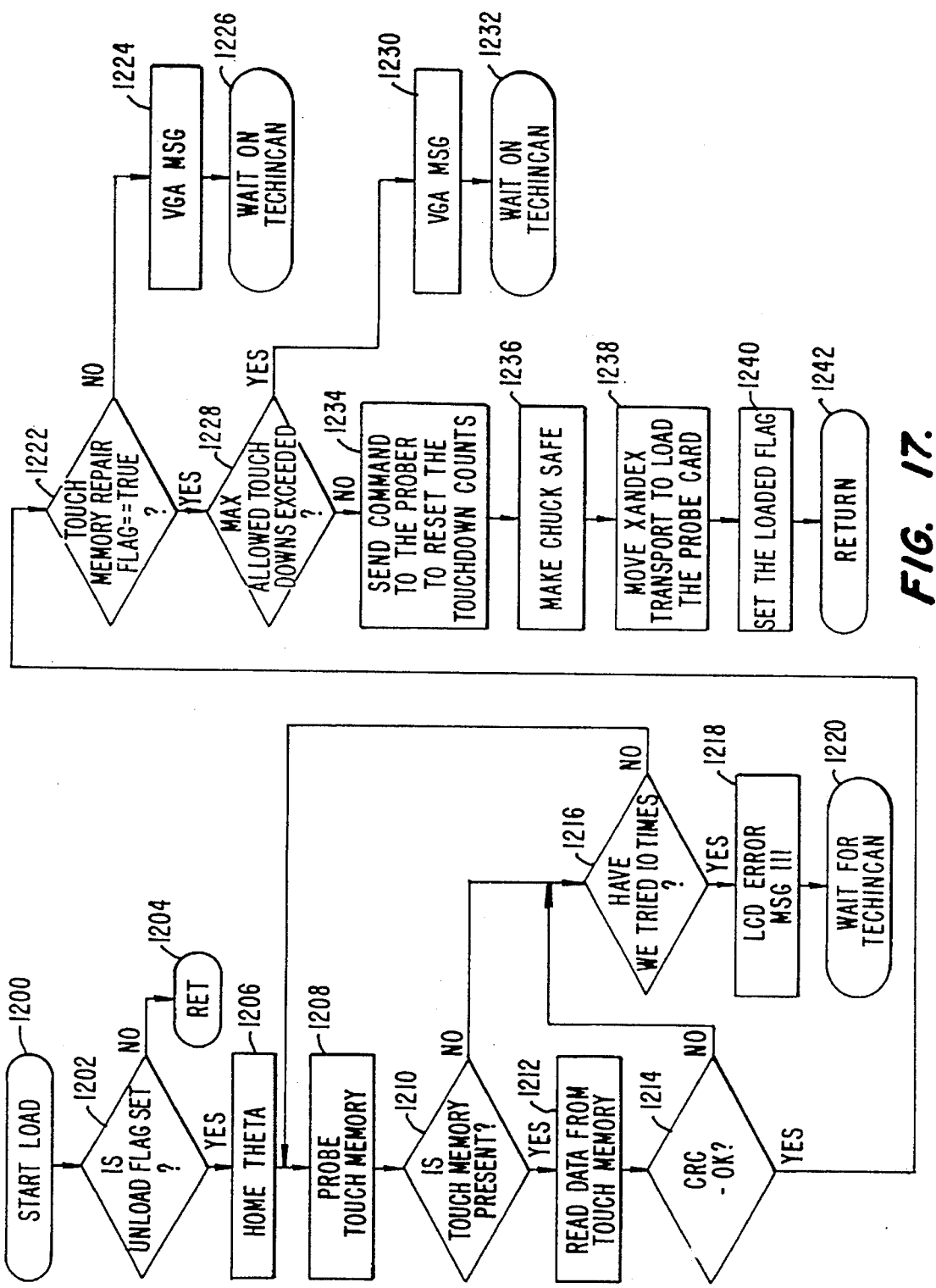
Figure 18:
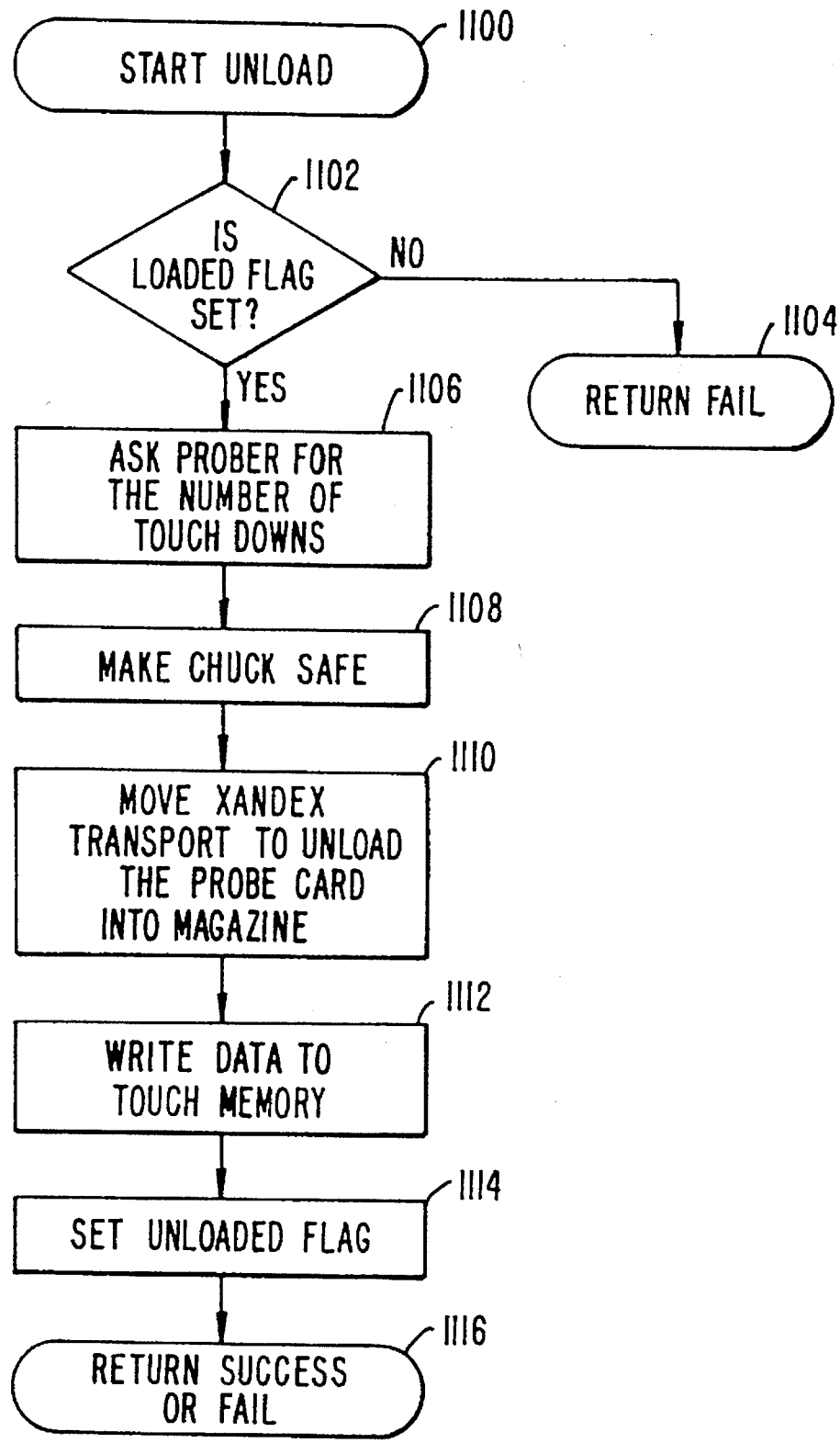

The load and unload probe card routines are illustrated in FIGS. 17 and 18, respectively. To load a probe card, the system first determines whether the unloaded flag is set at step 1202. If so, the theta ring is commanded to the home position at step 1206. The touch memory from the appropriate probe card stiffener is polled in steps 1208–1212. If the CRC is OK, the touch memory repair flag is in the correct state, and the maximum number of allowable touchdowns for the probe card has not been exceeded (steps 1214, 1222 and 1228), the system proceeds with the loading of the probe card (steps 1234 to 1240).

The unload probe card routine will now be described with reference to FIG. 18. The system first determines whether the loaded flag is set at step 1102. If so, the system asks the prober for the number of touchdowns which occurred over the time period that particular probe card has been loaded (step 1106). The system then secures the prober (step 1108) and then unloads the probe card stiffener with the arm/hand assembly (step 1110). When the stiffener is back in the magazine, the system updates the data in the touch memory (step 1112) and sets the unloaded flag (step 1114).

The above descriptions are illustrative and not restrictive. Many variations of the invention will become apparent to those of skill in the art upon review of this disclosure. Geometries of the individual elements my vary, and thus are not shape restricted. A wide variety of circuit elements could be utilized in place of those described herein. Moreover, it will be apparent that circuit elements could be replaced with software functionality, or, conversely, that software functionality could be replaced with circuit elements.

The scope of the present invention should, therefore, be determined not with reference to the above description, but instead should be determined with reference to the appended claims along with their full scope of equivalents.

What is claimed is:

1. A prober to test head interface, comprising:
   a stiffener for holding a probe card, the stiffener having an upper surface, a perimeter, an underside, a plurality of recesses in the underside around the perimeter, and first and second alignment holes;

a theta ring for holding the stiffener, the theta ring having first alignment pins for engaging the first alignment holes, a plurality of lock cylinders for engaging the recesses, and a machined lip against which the upper surface of the stiffener is forced by the lock cylinders;

a loader coupled to the prober for loading the stiffener in and unloading the stiffener from the theta ring, the loader having second alignment pins for engaging the second alignment holes; and a theta drive assembly coupled to the theta ring for rotating the theta ring to align the probe card with the test head.

2. The prober to test head interface of claim 1 wherein the test head comprises a contactor, and the theta ring comprises a plurality of clamp cylinders for locking the contactor in theta and Z while a probe card is being loaded or unloaded.

3. The prober to test head interface of claim 2 wherein the stiffener comprises third alignment holes for engaging pins on the contactor.

4. The prober to test head interface of claim 1 wherein the stiffener comprises a memory for storing operational data regarding the probe card.

5. The prober to test head interface of claim 4 wherein the operational data comprises a previous theta location for the probe card, and the theta drive assembly comprises a motorized belt drive, the motorized belt drive having a position feedback mechanism which the motorized belt drive employs to rotate the theta ring and position the probe card at the previous theta location.

6. The prober to test head interface of claim 4 wherein the memory comprises a touch memory positioned on the underside of the stiffener.

7. The prober to test head interface of claim 6 wherein the loader further comprises a memory reader for contacting the touch memory and reading the operational data stored therein.

8. The prober to test head interface of claim 1 wherein the loader moves the stiffener in first and second directions, the first direction being substantially parallel to a plane formed by the upper surface of the stiffener, and the second direction being substantially perpendicular to the plane, thereby facilitating the loading and unloading of probe cards in the prober.

9. The prober to test head interface of claim 1 wherein the loader comprises an arm assembly, the arm assembly comprising:

a shoulder coupled to the prober providing pitch, roll, and Z adjustments;

an articulated arm coupled to the shoulder comprising a plurality of segments;

a hand coupled to the arm for holding the stiffener, the second alignment pins being located on the hand;

a handle coupled to the arm facilitating manual manipulation of the arm assembly, and thereby positioning of the stiffener in the prober.

10. The prober to test head interface of claim 9 wherein the handle comprises at least one docking receptacle, and the interface further comprises at least one docking pin for engaging the at least one docking receptacle when the probe card and stiffener are in position beneath the theta ring.

11. The prober to test head interface of claim 10 wherein the at least one docking pin comprises a docking sensor for generating a signal when the at least one docking pin and the at least one docking receptacle are engaged.

12. The prober to test head interface of claim 1 wherein the loader comprises an arm assembly coupled to the prober for moving the stiffener in first and second directions, the first direction being substantially parallel to a plane defined by the upper surface of the stiffener, and the second direction being substantially perpendicular to the plane, the arm assembly comprising:

a Z mechanism coupled to the prober;

a first slide assembly coupled to the Z mechanism;

a first air cylinder coupled to the first slide assembly;

a second slide assembly coupled to the first air cylinder;

a second air cylinder coupled to the second slide assembly; and a hand coupled to the second air cylinder for holding the stiffener, the second alignment pins being located on the hand;

wherein the first air cylinder moves the second slide assembly with respect to the first slide assembly in the first direction, the second air cylinder moves the hand with respect to the second slide assembly in the first direction to a position directly below the theta ring, and the Z mechanism moves the arm assembly in the second direction, thereby causing the first alignment holes to engage the first alignment pins on the theta ring.

13. The prober to test head interface of claim 12 wherein the arm assembly is positioned in a magazine frame comprising at least one docking receptacle, and the interface further comprises at least one docking pin for engaging the at least one docking receptacle.

14. A prober to test head interface, comprising:

a stiffener for holding a probe card, the stiffener having an upper surface, a perimeter, an underside, a plurality of recesses in the underside around the perimeter, and first and second alignment holes;

a theta ring for holding the stiffener, the theta ring having first alignment pins for engaging the first alignment holes, a plurality of lock cylinders for engaging the recesses, and a machined lip against which the upper surface of the stiffener is forced by the lock cylinders;

a loader coupled to the prober for loading the stiffener in and unloading the stiffener from the theta ring, the loader having second alignment pins for engaging the second alignment holes, the loader comprising:

an articulated arm coupled to the prober comprising a plurality of segments;

a hand coupled to the arm for holding the stiffener, the second alignment pins being located on the hand; and a handle coupled to the arm facilitating manual manipulation of the arm assembly, and thereby positioning of the stiffener in the prober; and a theta drive assembly coupled to the theta ring for rotating the theta ring to align the probe card with the test head.

15. The prober to test head interface of claim 14 wherein the handle comprises at least one docking receptacle, and the interface further comprises at least one docking pin for engaging the at least one docking receptacle when the probe card and stiffener are in position beneath the theta ring.

16. The prober to test head interface of claim 15 wherein the at least one docking pin comprises a docking sensor for generating a signal when the at least one docking pin and the at least one docking receptacle are engaged.

17. The prober to test head interface of claim 14 wherein the stiffener comprises a memory for storing operational data regarding the probe card.

18. The prober to test head interface of claim 17 wherein the operational data comprises a previous theta location for the probe card, and the theta drive assembly comprises a motorized belt drive, the motorized belt drive having a position feedback mechanism which the motorized belt drive employs to rotate the theta ring and position the probe card at the previous theta location.

19. The prober to test head interface of claim 17 wherein the memory comprises a touch memory positioned on the underside of the stiffener.

20. The prober to test head interface of claim 19 wherein the hand further comprises a memory reader for contacting the touch memory and reading the operational data stored therein.

21. The prober to test head interface of claim 14 wherein the test head comprises a contactor, and the theta ring comprises a plurality of clamp cylinders for locking the contactor in theta while a probe card is being loaded or unloaded.

22. The prober to test head interface of claim 21 wherein the stiffener comprises third alignment holes for engaging pins on the contactor.

23. A method for loading a stiffener into a prober and aligning a probe card with a test head, the stiffener holding the probe card and having an upper surface, a perimeter, an underside, a plurality of recesses in the underside around the perimeter, and first and second alignment holes, the method comprising the steps of:

engaging the first alignment holes in the stiffener with first alignment pins on a theta ring, thereby positioning the stiffener in the theta ring;

engaging the recesses with a plurality of lock cylinders, thereby forcing the upper surface of the stiffener against a machined lip in the theta ring; and rotating the theta ring to align the probe card with the test head.

24. The method of claim 23, further comprising the steps of:

manually moving an articulated arm to a working position, the articulated arm comprising a hand having a plurality of second alignment pins;

manually placing the stifleher on the hand, thereby engaging the second alignment holes with the second alignment pins;

manually manipulating the articulated arm to position the stiffener under the theta ring; and moving the stiffener up into the theta ring.

25. The method of claim 24 wherein the stiffener comprises a touch memory, and the articulated arm comprises a memory reader, the step of manually placing the stiffener on the hand causing the touch memory to come in contact with the memory reader, the method further comprising the step of polling the touch memory with the memory reader to read and write operational data regarding the probe card.

26. The method of claim 23, further comprising the steps of:

moving a hand in first and second directions to engage the second alignment holes in the stiffener with second alignment pins on the hand, the stiffener being positioned outside the prober, the first direction being substantially parallel to a plane defined by the upper surface of the stiffener, and the second direction being substantially perpendicular to the plane;

moving the hand in the first direction to position the stiffener under the theta ring; and moving the hand in the second direction, thereby causing the first alignment holes to engage the first alignment pins on the theta ring.

27. The method of claim 26 wherein the stiffener comprises a touch memory, and is initially positioned on a first shelf in a rack having a plurality of shelves, each shelf for storing a stiffener, each shelf having a memory reader, the method further comprising the steps of:

removing the stiffener from the theta ring;

moving the hand and the stiffener in the first and second directions to position the stiffener on the first shelf, thereby causing the touch memory to come in contact with the memory reader; and polling the touch memory with the memory reader to read and write operational data regarding the probe card.

28. The method of claim 23 wherein the step of rotating the theta ring comprises employing a position feedback mechanism to rotate the theta ring to a previous theta position for the probe card, the previous theta position being stored in a touch memory associated with the probe card.

* * * * *